US011409029B2

(12) United States Patent
Sawabe et al.

(10) Patent No.: US 11,409,029 B2
(45) Date of Patent: Aug. 9, 2022

(54) LIGHT-EMITTING DEVICE

(71) Applicant: NICHIA CORPORATION, Anan (JP)

(72) Inventors: Shinichi Sawabe, Anan (JP); Yuki Ogawa, Tokushima (JP); Takeshi Morikawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/446,286

(22) Filed: Aug. 27, 2021

(65) Prior Publication Data

US 2022/0066085 A1    Mar. 3, 2022

(30) Foreign Application Priority Data

Aug. 28, 2020 (JP) .............................. JP2020-144481
Nov. 30, 2020 (JP) .............................. JP2020-198853

(51) Int. Cl.
    *F21V 8/00* (2006.01)

(52) U.S. Cl.
    CPC ........... *G02B 6/0031* (2013.01); *G02B 6/003* (2013.01)

(58) Field of Classification Search
    CPC .............................. G02B 6/0031; G02B 6/003
    See application file for complete search history.

(56) References Cited

U.S. PATENT DOCUMENTS

| 10,418,528 | B2 * | 9/2019 | Sogai | ................... | H01L 33/005 |
| 2012/0032578 | A1 | 2/2012 | Annen et al. | | |
| 2013/0070479 | A1 | 3/2013 | Ito | | |
| 2014/0284652 | A1 | 9/2014 | Shimada et al. | | |
| 2016/0172550 | A1 | 6/2016 | Suto et al. | | |
| 2019/0058095 | A1 | 2/2019 | Choi et al. | | |
| 2020/0041085 | A1 | 2/2020 | Miyairi et al. | | |
| 2020/0144466 | A1 * | 5/2020 | Endo | ..................... | H01L 33/507 |
| 2021/0305218 | A1 * | 9/2021 | Ikeda | ..................... | H01L 33/54 |

FOREIGN PATENT DOCUMENTS

| JP | 2010283281 A | 12/2010 |
| JP | 2012195552 A | 10/2012 |
| JP | 2013069423 A | 4/2013 |
| JP | 2014187319 A | 10/2014 |

(Continued)

*Primary Examiner* — Leah Simone Macchiarolo
(74) *Attorney, Agent, or Firm* — Hunton Andrews Kurth LLP

(57) ABSTRACT

A light-emitting device includes first and second light-emitting elements arranged along a first direction; at least one light-transmissive member having a lateral surface and covering the upper surfaces of the first and second light-emitting elements; and a light-reflective member in contact with at least portions of the lateral surfaces of the first and second light-emitting elements, and the lateral surface of the light-transmissive member. The light-transmissive member has first and second surfaces exposed from the light-reflective member and located above the upper surfaces of the first and second light-emitting elements, respectively. The light-reflective member includes a first portion located between the first surface and the second surface in the first direction above the first and second surfaces. The first portion includes at least one concave curved surface in a first cross-section extending along the first direction and perpendicular to the upper surface of the first light-emitting element.

11 Claims, 23 Drawing Sheets

(56) References Cited

FOREIGN PATENT DOCUMENTS

| | | | |
|---|---|---|---|
| JP | 2016115934 | A | 6/2016 |
| JP | 2019036713 | A | 3/2019 |
| JP | 2020025063 | A | 2/2020 |
| JP | 2020053642 | A | 4/2020 |
| JP | 2020053643 | A | 4/2020 |

\* cited by examiner

LIGHT-EMITTING DEVICE

CROSS-REFERENCE TO RELATED APPLICATIONS

This application claims priority to Japanese Patent Application No. 2020-144481, filed on Aug. 28, 2020, and Japanese Patent Application No. 2020-198853, filed on Nov. 30, 2020, the disclosures of all of which are hereby incorporated by reference in their entirety.

BACKGROUND OF THE INVENTION

1. Field of the Invention

The present disclosure relates to a light-emitting device.

2. Description of Related Art

A light-emitting device having an LED is widely used as a light source for a backlight for a liquid-crystal display device. For example, Japanese Unexamined Patent Application Publication No. 2019-036713 discloses a side-view type LED package including two LEDs. Such a side-view type LED package is used such that a light exit surface of the side-view type LED package faces a lateral surface of a light-guiding plate. Light emitted from the LED package enters the light-guiding plate through the lateral surface of the light-guiding plate.

SUMMARY

There is a demand for enhancement in the optical coupling efficiency between a light-emitting device and a light-guiding plate in a backlight including the light-guiding plate as a portion.

A light-emitting device according to an embodiment in the present disclosure includes a first light-emitting element and a second light-emitting element that are arranged along a first direction and each having an upper surface and lateral surfaces; at least one light-transmissive member having at least one lateral surface and covering the upper surface of the first light-emitting element and the upper surface of the second light-emitting element; and a light-reflective member in contact with at least portions of the lateral surfaces of the first light-emitting element, at least portions of the lateral surfaces of the second light-emitting element, and the lateral surface of the light-transmissive member. The light-transmissive member has a first surface and a second surface that are exposed from the light-reflective member, the first surface being located above the upper surface of the first light-emitting element, the second surface being located above the upper surface of the second light-emitting element. The light-reflective member comprises a first portion located between the first surface and the second surface in the first direction above the first surface and the second surface. The first portion includes at least one concave curved surface in a first cross-section extending along the first direction and being perpendicular to the upper surface of the first light-emitting element.

According to certain embodiments in the present disclosure, a light-emitting device having an enhanced optical coupling efficiency to a light-guiding plate can be obtained.

DETAILED DESCRIPTION

Figure 1:
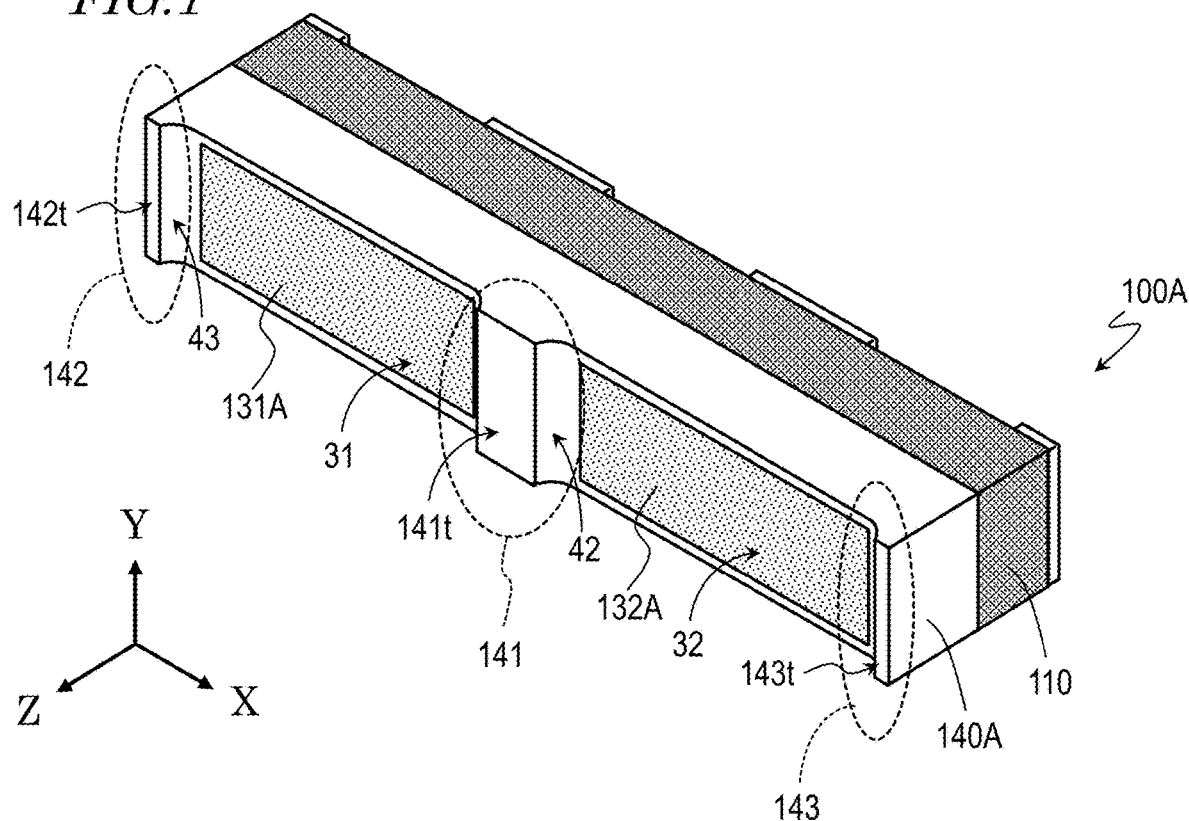
FIG. 1 is a schematic perspective top view of an exemplary light-emitting device according to a first embodiment in the present disclosure.

Embodiments of the present disclosure will be described below with reference to the accompanying drawings. Embodiments below are intended to give examples and do not limit surface light sources in the present disclosure thereto. For example, the numerical values, shapes, materials, steps, the order of the steps, and the like described in the embodiments below are merely examples and can be modified in various ways as long as technical contradictions do not arise. The embodiments described below are only intended to give examples and can be combined in various ways as long as technical contradictions do not arise.

The dimensions, shapes, and the like of the components shown in the drawings may be exaggerated for ease of understanding, and may not represent the dimension, the shape, and the size relationship between components in an actual surface light source. In order to prevent the drawings from being excessively complicated, illustration of the components may be partially omitted, or an end view showing only a cross-section may be shown as a cross-sectional view.

In the description below, components having substantially the same function will be shown with the same reference numerals, and repeated descriptions of such components may be omitted. In the description below, terms representing particular directions or positions (e.g., "upper", "lower", "right", "left", and other terms including these words) may be used. These terms are used merely for the sake of ease of understanding, representing relative directions or relative positions in the referenced drawings. As far as the relative directions or positions indicated by the terms "upper", "lower", and the like designate the same directions or positions in the referenced drawings, drawings other than shown in the present disclosure, actual products, and manufacturing equipment does not necessarily have the same arrangement as shown in the reference drawings. The term "parallel" as used in the present disclosure encompasses a case in which an angle between two straight lines, sides, or planes is in the range of about 0°±5° unless otherwise stated. Further, the term "perpendicular" or "orthogonal" as used in the present disclosure encompasses a case in which an angle between two straight lines, sides, or planes is in the range of about 90°±5° unless otherwise stated.

First Embodiment

Figure 2:
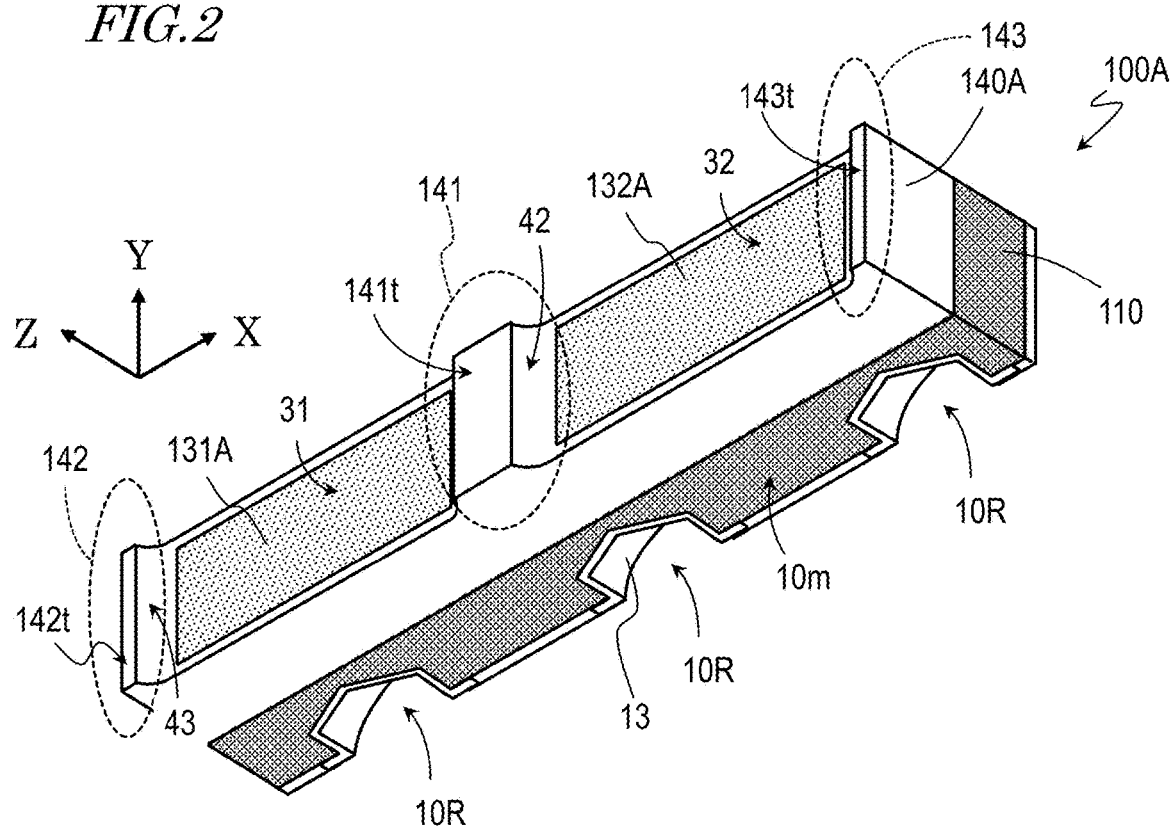
FIG. 2 is a schematic perspective bottom view of the light-emitting device shown in FIG. 1.
Figure 3:
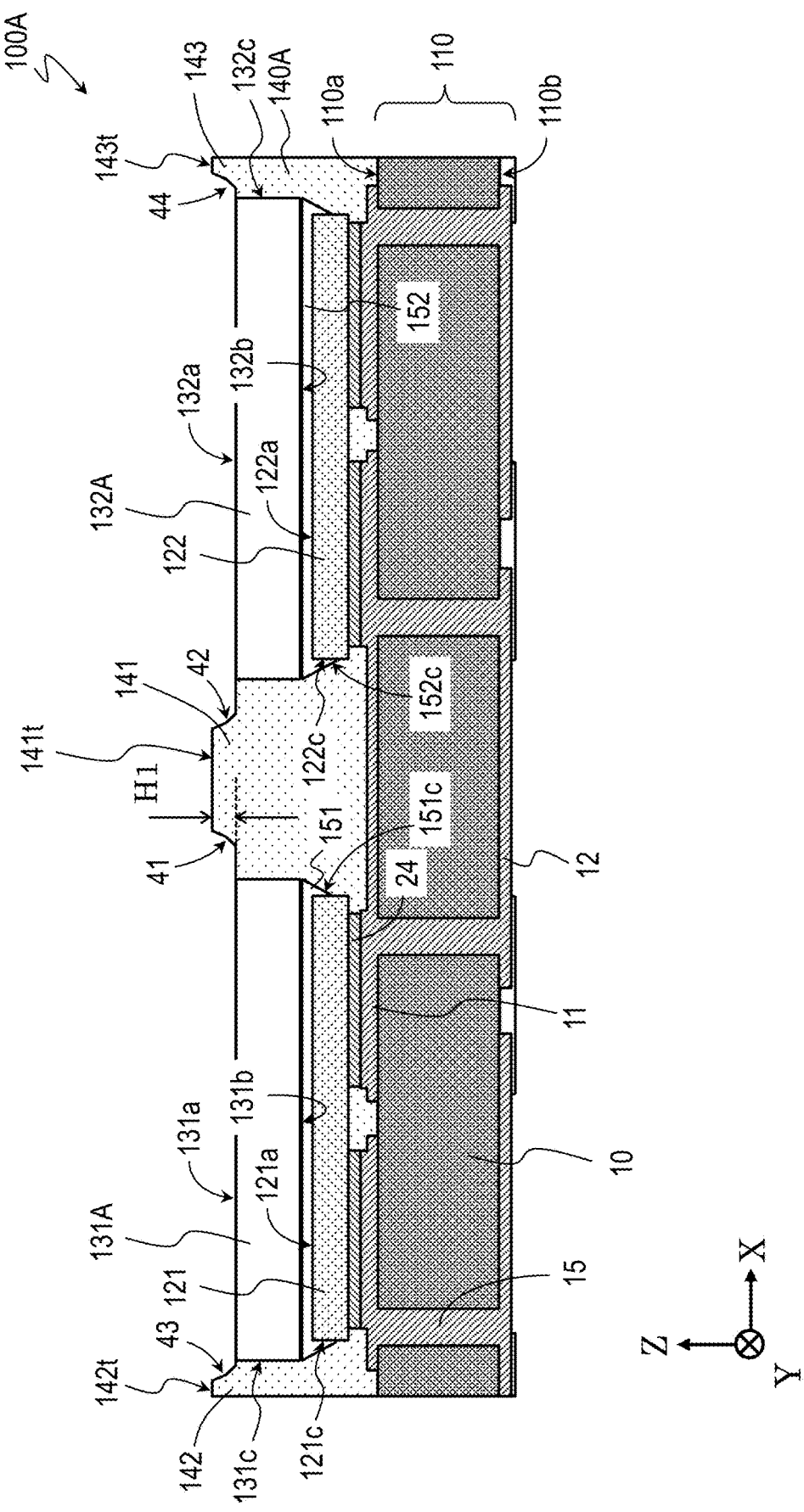
FIG. 3 is a schematic cross-sectional view of the light-emitting device shown in FIG. 1 and FIG. 2.

FIG. 1 and FIG. 2 schematically show an external appearance of a light-emitting device according to a first embodiment in the present disclosure. FIG. 3 is a schematic cross-sectional view of a light-emitting device 100A shown in FIG. 1 and FIG. 2. FIG. 1 to FIG. 3 also show arrows indicating the X direction, the Y direction, and the Z direction orthogonal to one another for ease of description. The arrows indicating these directions may be shown also in other drawings in the present disclosure. In the present specification, the X direction in each drawing may be referred to as a first direction.

FIG. 3 corresponds to a schematic cross-sectional view of the light-emitting device 100A taken along a plane parallel to the ZX plane near the center of the light-emitting device 100A. As shown in FIG. 3, the light-emitting device 100A includes a first light-emitting element 121 and a second light-emitting element 122. The first light-emitting element 121 has an upper surface 121a and lateral surfaces 121c. Likewise, the second light-emitting element 122 has an upper surface 122a and lateral surfaces 122c. Each of the first light-emitting element 121 and the second light-emitting element 122 includes electrodes 24 that are disposed on a respective lower surface opposite to a respective upper surface. FIG. 3 schematically shows the structure of the light-emitting device 100A in a cross-section extending along the first direction and perpendicular to the upper surface 121a of the first light-emitting element 121. In the present specification, the ZX cross-section may be referred to as a "first cross-section".

The light-emitting device 100A further includes a substrate 110 that supports these light-emitting elements. The substrate 110 has an upper surface 110a. The first light-emitting element 121 and the second light-emitting element 122 are disposed on the upper surface 110a of the substrate 110 along the X direction (first direction) in the drawings.

In the illustrative structure shown in FIG. 1 to FIG. 3, the light-emitting device 100A includes a first light-transmissive member 131A, a second light-transmissive member 132A, and a light-reflective member 140A, in addition to the first light-emitting element 121, the second light-emitting element 122, and the substrate 110. The first light-transmissive member 131A has an upper surface 131a, a lower surface 131b, and lateral surfaces 131c located between the upper surface 131a and the lower surface 131b and is located above the upper surface 121a of the first light-emitting element 121. In this example, the Z direction in the drawings refers to a direction from the first light-emitting element 121 to the first light-transmissive member 131A, and a normal to the upper surface 121a of the first light-emitting element 121 is substantially parallel to the Z direction.

As schematically shown in FIG. 3, a light-transmissive first bonding member 151 is disposed between the first light-transmissive member 131A and the first light-emitting element 121 in this case. The first light-transmissive member 131A is bonded to the upper surface 121a of the first light-emitting element 121 via the first bonding member 151. A portion of the first bonding member 151 can be located on the lateral surfaces 121c of the first light-emitting element 121. The terms "light-transmissive" and "transmit light" as used in the present specification are not limited to "transparent" but are interpreted such that diffusibility of incident light is also included. For example, a light-diffusing material having a refractive index different from a refractive index of a base material can be dispersed in the first light-transmissive member 131A, which allows for imparting a light-diffusing function.

Similarly to the first light-transmissive member 131A, the second light-transmissive member 132A also has an upper surface 132a, a lower surface 132b, and lateral surfaces 132c. In the illustrative structure shown in FIG. 3, the second light-transmissive member 132A is bonded to the second light-emitting element 122 via a second bonding member 152, and is therefore located above the upper surface 122a of the second light-emitting element 122. In this example, the second bonding member 152 is partially located on the lateral surfaces 122c of the second light-emitting element 122.

The light-reflective member 140A is formed on the substrate 110 to surround the first light-emitting element 121 and the second light-emitting element 122 and to cover a portion of the upper surface 110a of the substrate 110. More specifically, the light-reflective member 140A is in contact with portions of the lateral surfaces 121c of the first light-emitting element 121 not covered with the first bonding member 151, portions of the lateral surfaces 122c of the second light-emitting element 122 not covered with the second bonding member 152, an outer surface 151c of the first bonding member 151, an outer surface 152c of the second bonding member 152, the lateral surfaces 131c of the first light-transmissive member 131A, and the lateral surfaces 132c of the second light-transmissive member 132A.

As shown in FIG. 1 to FIG. 3, the light-reflective member 140A does not cover the entire upper surface 131a of the first light-transmissive member 131A. The light-reflective member 140A does not also cover the entire upper surface 132a of the second light-transmissive member 132A. In other words, a portion or the whole of the upper surface 131a of the first light-transmissive member 131A and a portion or the whole of the upper surface 132a of the second light-transmissive member 132A are exposed from the light-reflective member 140A. Portions of the upper surfaces of the light-transmissive members (the first light-transmissive member 131A and the second light-transmissive member 132A in this example) exposed from the light-reflective member 140A constitute a light exit surface through which light emitted from the light-emitting elements is extracted. A region of the upper surface 131a of the first light-transmissive member 131A exposed from the light-reflective member 140A and a region of the upper surface 132a of the second light-transmissive member 132A exposed from the light-reflective member 140A are hereinafter respectively referred to as a first surface 31 and a second surface 32 for convenience. As shown in FIG. 1 and FIG. 2, in this example, each of the first surface 31 and the second surface 32 has a rectangular shape that is longer in the X direction than in the Y direction in the drawings.

As shown in FIG. 3, the whole upper surface 131a of the first light-transmissive member 131A corresponds to the first surface 31, and the whole upper surface 132a of the second light-transmissive member 132A corresponds to the second surface 32 in this example. The first surface 31 is located above the upper surface 121a of the first light-emitting element 121, and the second surface 32 is located above the upper surface 122a of the second light-emitting element 122. In the example shown in FIG. 1 to FIG. 3, each of the first surface 31 and the second surface 32 is substantially flat. The shapes of the first surface 31 and the second surface 32 is not necessarily flat, but can have a recessed shape in a cross-sectional view as described below.

The light-reflective member 140A includes a first portion 141. The first portion 141 is a portion of the light-reflective member 140A located above the first surface 31 and the second surface 32 and between the first surface 31 and the second surface 32 in the X direction in the drawings. For example, as shown in FIG. 3, the first portion 141 has a first top portion 141t that is flat and substantially parallel to the first surface 31 and the second surface 32 in this example. The term "top portion" as used herein refers to a portion of the light-reflective member 140A farthest from the light-transmissive members (the first light-transmissive member 131A and the second light-transmissive member 132A in the example shown in FIG. 3) in the Z direction in the drawings.

The surface of the first portion 141 of the light-reflective member 140A includes at least one concave curved surface in a cross-sectional view. As shown in FIG. 3, the at least one concave curved surface of the first portion 141 may include a first curved surface 41 and a second curved surface 42 in the ZX cross-section (that is, the first cross-section) in this case. The first curved surface 41 is located between the first top portion 141t of the first portion 141 and the first surface 31 of the first light-transmissive member 131A. The second curved surface 42 is located between the first top portion 141t of the first portion 141 and the second surface 32 of the second light-transmissive member 132A. As will be described below in detail, the surfaces of the first portion 141 include at least one concave curved surface in a cross-sectional view, which allows light emitted from the light-emitting device 100A to be more effectively used, so that the optical coupling efficiency of the light-emitting device 100A to the light-guiding plate can be enhanced.

In the illustrative structure shown in FIG. 1 to FIG. 3, the light-reflective member 140A further includes a second portion 142 and a third portion 143 at both ends of the light-reflective member 140A in the X direction in the drawings. The second portion 142 is located above the first surface 31 (entire upper surface 131a in this case) of the first light-transmissive member 131A, and the third portion 143 located above the second surface 32 (entire upper surface 132a in this case) of the second light-transmissive member 132A in the Y direction. As shown in FIG. 3, the second portion 142 of the light-reflective member 140A is located opposite to the first portion 141 in the X direction in the drawings with respect to the position of the first surface 31. On the other hand, the third portion 143 of the light-reflective member 140A is located opposite to the first portion 141 in the X direction in the drawings with respect to the position of the second surface 32. In other words, in the cross-section shown in FIG. 3, the first surface 31 of the first light-transmissive member 131A is located between the first portion 141 and the second portion 142 of the light-reflective member 140A, and the second surface 32 of the second light-transmissive member 132A is located between the first portion 141 and the third portion 143 of the light-reflective member 140A.

In the example shown in FIG. 1 to FIG. 3, the second portion 142 and the third portion 143 of the light-reflective member 140A respectively include a second top portion 142*t* and a third top portion 143*t*. Similarly to the first top portion 141*t*, the second top portion 142*t* and the third top portion 143*t* are portions of the light-reflective member 140A that are farthest from the first light-transmissive member 131A or the second light-transmissive member 132A in the Z direction in the drawings. In this example, similarly to the first top portion 141*t*, the second top portion 142*t* and the third top portion 143*t* are substantially flat surfaces.

Further, in this example, each of a surface of the second portion 142 and a surface of the third portion 143 at least partially include a concave curved surface. The surfaces of the second portion 142 include a concave third curved surface 43 between the second top portion 142*t* and the first surface 31 of the first light-transmissive member 131A in the ZX cross-section. The surfaces of the third portion 143 include a concave fourth curved surface 44 between the third top portion 143*t* and the second surface 32 of the second light-transmissive member in the ZX cross-section.

Figure 4:
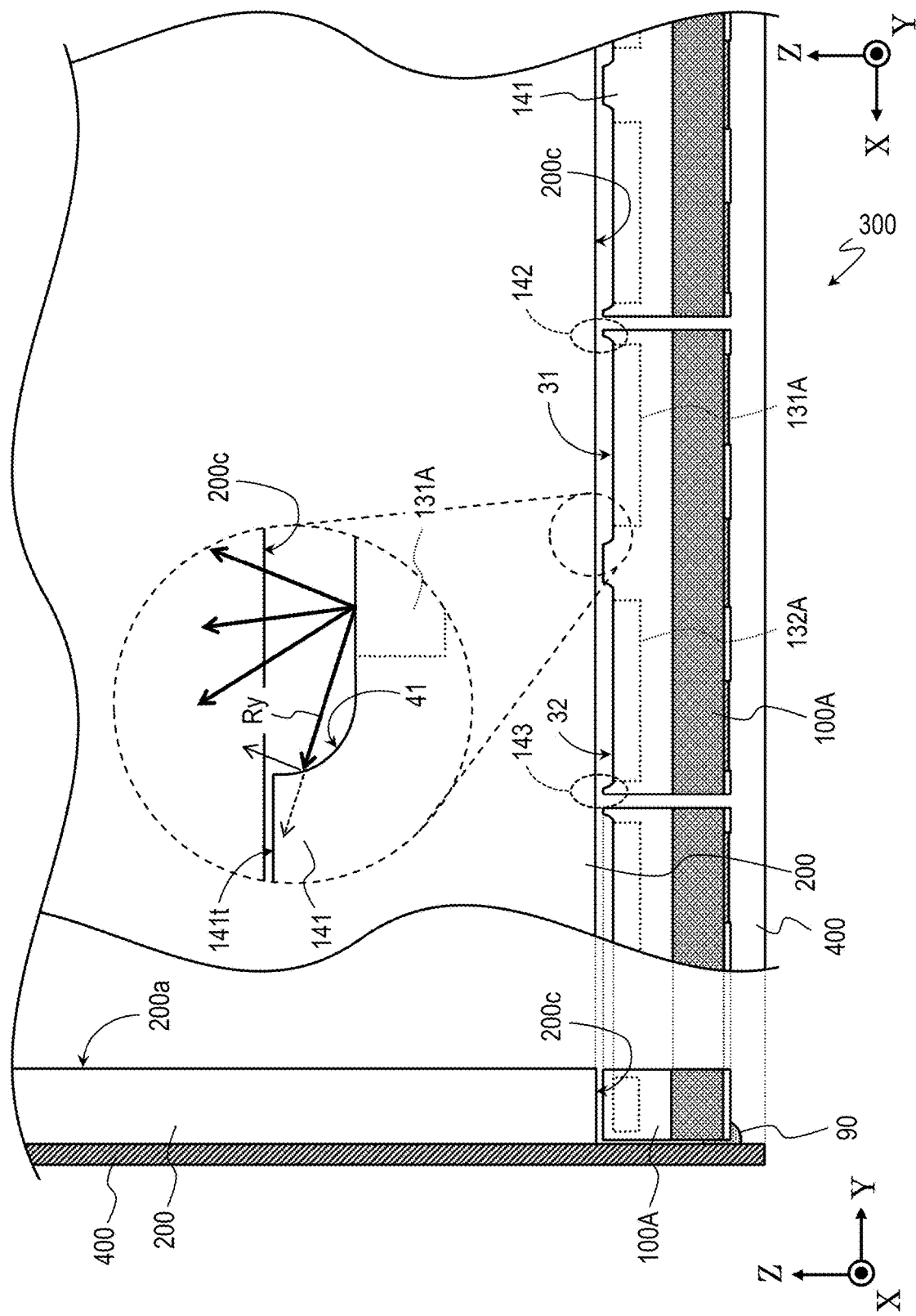
FIG. 4 is a schematic view of a backlight including an exemplary light-emitting device according to an embodiment in the present disclosure.

FIG. 4 schematically shows an example of a backlight including the light-emitting device 100A. A backlight 300 shown in FIG. 4 includes the light-emitting device 100A described above and a light-guiding plate 200 having an upper surface 200*a* and a plurality of lateral surfaces 200*c*. In FIG. 4, both the external appearance of the backlight 300 when viewed from the upper surface 200*a* side of the light-guiding plate 200 perpendicularly to the upper surface 200*a* and the external appearance of the backlight 300 when viewed from a lateral side are shown in a single drawing.

As shown in FIG. 4, the light-emitting device 100A is mounted on a wiring substrate 400 together with the light-guiding plate 200 such that the first surface 31 of the first light-transmissive member 131A and the second surface 32 of the second light-transmissive member 132A face a corresponding one of the lateral surfaces 200*c* of the light-guiding plate 200. At this time, the first top portion 141*t* of the first portion 141 of the light-reflective member 140A can be brought into contact with a corresponding lateral surface 200*c* of the light-guiding plate 200.

A portion or the whole of the first top portion 141*t* of the first portion 141 is in contact with a corresponding lateral surface 200*c* of the light-guiding plate 200, which can avoid direct contact of the first surface 31 and the second surface 32 serving as the light exit surface with the light-guiding plate 200. Avoiding the contact of the first surface 31 and the second surface 32 with the light-guiding plate 200 allows for reducing breakage and the like of the first light-transmissive member 131A or the second light-transmissive member 132A due to the contact with the light-guiding plate 200 can be prevented.

In this example, the first top portion 141*t* of the first portion 141 of the light-reflective member 140A is substantially flat. With the first portion 141 having the first top portion 141*t* in such a shape, concentration of stress at the first portion 141 when the first portion 141 is brought into contact with the light-guiding plate 200 or the like can be reduced compared with the case in which, for example, the first portion 141 is brought into a point contact with an external member such as the light-guiding plate 200. This can prevent breakage of the first portion 141 due to the contact with an external member such as the light-guiding plate 200.

As described above, with the light-reflective member 140A including a portion (such as the first portion 141) projecting toward a side opposite to the first light-emitting element 121 and the second light-emitting element 122 with respect to the first surface 31 and the second surface 32, the first surface 31 and the second surface 32 can be prevented from being brought into contact with the light-guiding plate 200. This can avoid breakage or the like of the light-transmissive members due to contact with the light-guiding plate, so that reliability of the light-emitting device can be improved.

However, excessively increasing the distance between the lateral surface 200*c* of the light-guiding plate 200 and the first surface 31 and the second surface 32 may result in reduction in the optical coupling efficiency between the light-guiding plate 200 and the light-emitting device 100A. The distance between the lateral surface 200*c* of the light-guiding plate 200 and the first surface 31 and the second surface 32 is preferably 10 µm or more and 100 µm or less, more preferably 20 µm or more and 50 µm or less. In other words, it is advantageous that the height of the first portion 141 fall within the range of 10 µm or more and 100 µm or less. As used herein, the term "height of the first portion 141" can be defined as a distance H1 from an end of the first surface 31 or an end of the second surface 32 to the first top portion 141*t* of the first portion 141 along the Z direction in the ZX cross-section (see FIG. 3).

In the light-emitting device 100A, light that is emitted from the first light-emitting element 121 and incident on the first light-transmissive member 131A is extracted from the light-emitting device 100A through the first surface 31 of the first light-transmissive member 131A. Likewise, light that is emitted from the second light-emitting element 122 and incident on the second light-transmissive member 132A is extracted from the light-emitting device 100A through the second surface 32 of the second light-transmissive member 132A.

A light emitted from the first surface 31 and a light emitted from the second surface 32 diverge as each light travels toward the light-guiding plate 200. A component of each of these lights traveling in a direction at a large angle with respect to the Z direction in the drawings enters the first portion 141 before reaching a lateral surface 200*c* of the light-guiding plate 200 as schematically indicated by a solid arrow Ry in FIG. 4. That is, a portion of light that is emitted from the first surface 31 or the second surface 32 and travels toward the light-guiding plate 200 is shielded by the first portion 141. The existence of such a component may lead to reduction in the optical coupling efficiency between the light-emitting device 100A and the light-guiding plate 200.

As described referring to FIG. 3, the surfaces of the first portion 141 includes the first curved surface 41 between the first top portion 141*t* of the first portion 141 and an end of the first surface 31 and the second curved surface 42 between the second top portion 142*t* and an end of the second surface 32 in the present embodiment. Accordingly, the distance from the first surface 31 to the first top portion 141*t* in the X direction is increased compared with the case in which the surfaces of the first portion 141 has a shape sharply extending upward from the end of the first surface 31 in the Z direction in the ZX cross-section. Also, the distance from the second surface 32 to the first top portion 141t in the X direction is increased compared with the case in which the surface of the first portion 141 has a shape sharply extending upward from the end of the second surface 32 in the Z direction in the ZX cross-section.

The first portion 141 having such a shape allows a light ray to be incident on the light-guiding plate 200 at a larger angle with respect to the optical axis of the light-emitting element. Thus, according to embodiments in the present disclosure, in a light traveling toward the light-guiding plate 200, a component shielded by the first portion 141 can be reduced. Such a structure allows light emitted from the first surface 31 or the second surface 32 to more efficiently enter the light-guiding plate 200, and allows for avoiding reduction in the optical coupling efficiency between the light-emitting device 100A and the light-guiding plate 200 even when the first surface 31 and the second surface 32 are about 100 µm away from the light-guiding plate 200. That is, light emitted from the first light-emitting element 121 and the second light-emitting element 122 can be more effectively used. The distance from the first surface 31 to the first top portion 141t in the X direction and the distance from the second surface 32 to the first top portion 141t in the X direction are preferably 10 µm or more and 100 µm or less, more preferably 10 µm or more and 50 µm or less.

In particular, in this example, the light-reflective member 140A further includes, at both ends of the light-reflective member 140A in the X direction in the drawings, the second portion 142 and the third portion 143 projecting in the +Z direction with respect to the first surface 31 of the first light-transmissive member 131A and the second surface 32 of the second light-transmissive member 132A. With this structure, direct contact of the first surface 31 and the second surface 32 with the light-guiding plate 200 can be more effectively prevented. With the second top portion 142t and the third top portion 143t that are flat as in the example shown in FIG. 3, stress concentration at the second portion 142 and the third portion 143 when the second portion 142 and the third portion 143 are brought into contact with the light-guiding plate 200 or the like can be prevented, so that the effect of avoiding breakage of the second portion 142 and/or the third portion 143 is expected to be obtained.

Also, appropriate adjustment in the heights of the second portion 142 and the third portion 143 can facilitate mounting of the light-emitting device 100A on the wiring substrate 400 such that the first surface 31 and the second surface 32 face the lateral surface 200c of the light-guiding plate 200 in parallel. Similarly to the height of the first portion 141, each of the terms "height of the second portion 142" and "height of the third portion 143" is defined as the distance from the end of the first surface 31 or the end of the second surface 32 to the second top portion 142t or the third top portion 143t along the Z direction in the ZX cross-section.

With the surfaces of the second portion 142 including the concave third curved surface 43, in a light traveling from the first surface 31 to the light-guiding plate 200 at a large angle with respect to the optical axis of the first light-emitting element 121, a component shielded by the second portion 142 can be reduced. Likewise, with the surfaces of the third portion 143 including the concave fourth curved surface 44, in a light traveling from the second surface 32 to the light-guiding plate 200 at a large angle with respect to the optical axis of the second light-emitting element 122, a component shielded by the third portion 143 can be reduced.

Thus, even when the light-reflective member 140A has portions projecting in the +Z direction with respect to the first surface 31 and the second surface 32 as described above, with the surfaces of these portions having concave curved portions, reduction in the utilization efficiency of light of the backlight due to these portions of the light-reflective member 140A can be inhibited.

Figure 5:
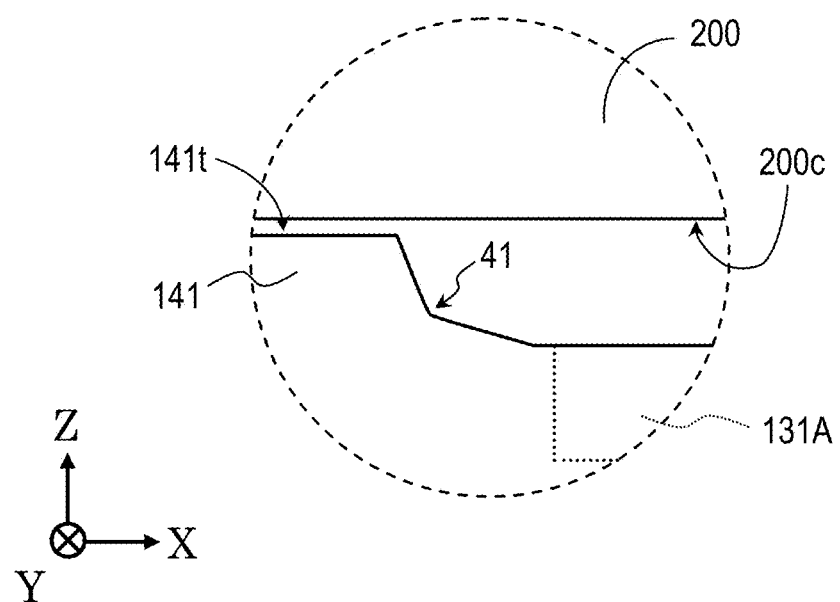
FIG. 5 is a schematic cross-sectional view showing another exemplary shape of a first portion of a light-reflective member.

FIG. 1 to FIG. 4 show an example in which each of the first curved surface 41 to the fourth curved surface 44 has an arc shape that is a portion of a perfect circle. However, the first curved surface 41 to the fourth curved surface 44 may have other shapes in the ZX cross-section. Examples of a shape of each of the first curved surface 41 to the fourth curved surface 44 in a cross-sectional view include a shape corresponding to a portion of an ellipse or an oblong, an uneven shape, a shape including a linear portion, or a combination of these shapes. Alternatively, at least one of the first curved surface 41 to the fourth curved surface 44 can have a cross-sectional shape represented by a larger curvature (shape more approximate to a polygonal line) as schematically shown in FIG. 5.

Second Embodiment

Figure 6:
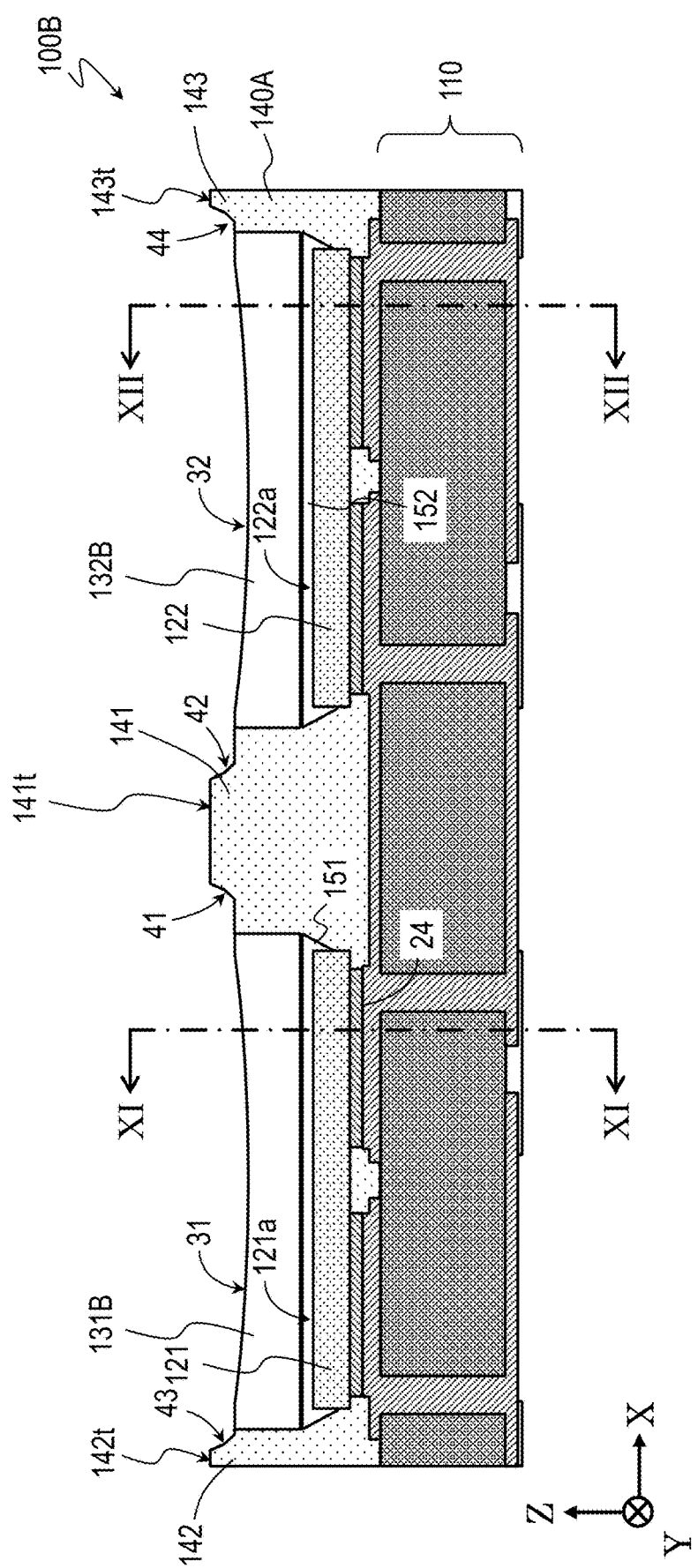
FIG. 6 is a schematic cross-sectional view of an exemplary light-emitting device according to a second embodiment in the present disclosure.

FIG. 6 schematically shows a cross-section of a light-emitting device according to a second embodiment in the present disclosure. A light-emitting device 100B shown in FIG. 6 differs from the light-emitting device 100A described above in including a first light-transmissive member 131B instead of the first light-transmissive member 131A and including a second light-transmissive member 132B instead of the second light-transmissive member 132A.

Similarly to the first embodiment, the first light-transmissive member 131B and the second light-transmissive member 132B respectively have the first surface 31 and the second surface 32 that are exposed from the light-reflective member 140A. In the present embodiment, each of the first surface 31 and the second surface 32 has a recessed shape in the ZX cross-section.

The central portion of the first surface 31 of the first light-transmissive member 131B is recessed in the Z direction in the drawings with respect to the ends of the first surface 31 in the X direction in the drawings. Likewise, the central portion of the second surface 32 of the second light-transmissive member 132B is recessed in the Z direction in the drawings with respect to the ends of the second surface 32 in the X direction in the drawings. As will be described below referring to examples, the first surface 31 and the second surface 32 are recessed in the ZX cross-section, so that divergence of light in the ZX plane is reduced. That is, light emitted from the light-emitting elements is concentrated above the light-emitting elements, so that, for example, the influence of the effect of shielding light by the first portion 141 is reduced. Accordingly, light can be more efficiently introduced into the light-guiding plate in an application to the backlight.

The shape of each of the first surface 31 and the second surface 32 in the ZX cross-section is not limited to the arc shape illustrated in FIG. 6 as long as the shape is recessed toward the first light-emitting element 121 or the second light-emitting element 122 with respect to the ends of a respective one of the first surface 31 and the second surface 32. The first surface 31 and/or the second surface 32 can include a projecting portion in the ZX cross-section.

Figure 7:
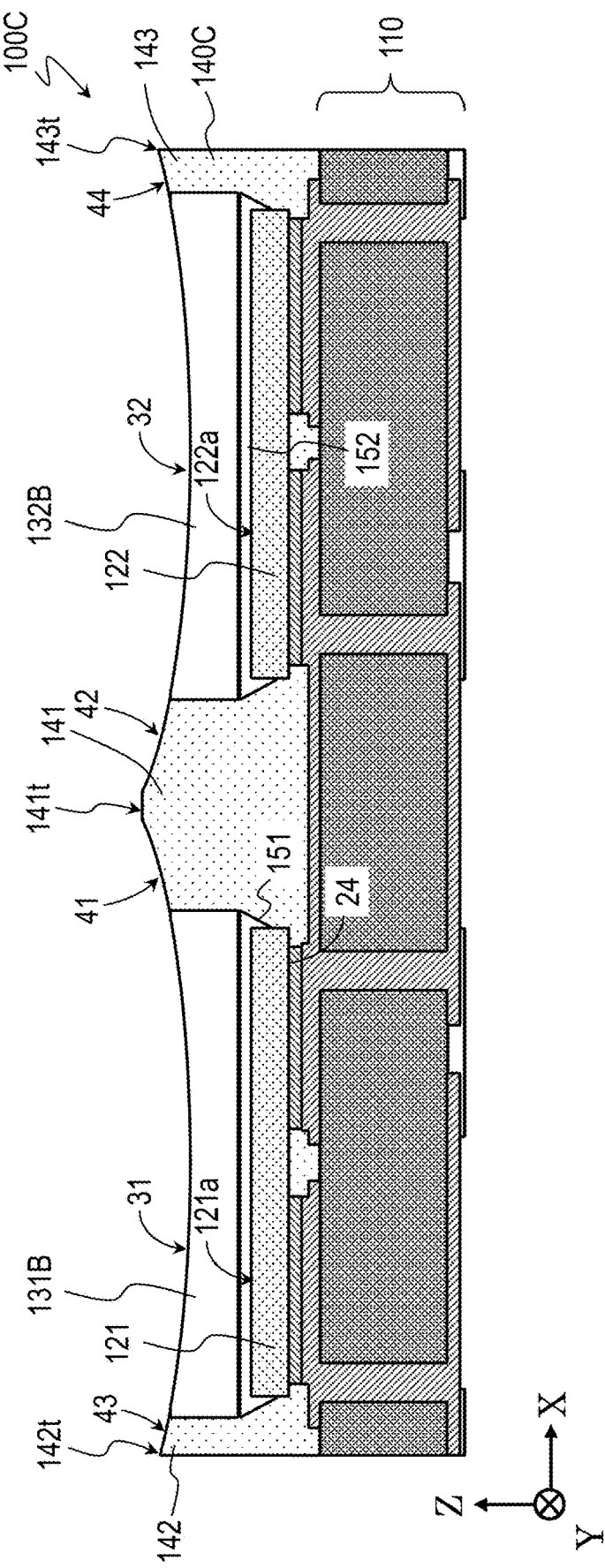
FIG. 7 is a schematic cross-sectional view of another exemplary light-emitting device according to the second embodiment in the present disclosure.

FIG. 7 schematically shows another example of the first surface 31 and the second surface 32 in the cross-sectional shape. A light-emitting device 100C shown in FIG. 7 differs from the light-emitting device 100B shown in FIG. 6 in including a light-reflective member 140C instead of the light-reflective member 140A.

The light-reflective member 140C includes the first portion 141 having the first curved surface 41 and the second curved surface 42, the second portion 142 having the third curved surface 43, and the third portion 143 having the fourth curved surface 44. As schematically shown in FIG. 7, in this example, the first curved surface 41 of the first portion 141 of the light-reflective member 140C, the first surface 31 of the first light-transmissive member 131B, and the third curved surface 43 of the second portion 142 of the light-reflective member 140C constitute a single curved surface. With this structure, light emitted from the first surface 31 can be inhibited from being shielded by the first curved surface 41 of the first portion 141 and the third curved surface 43 of the second portion 142.

In this example, the second curved surface 42 of the first portion 141 of the light-reflective member 140C, the second surface 32 of the second light-transmissive member 132B, and the fourth curved surface 44 of the third portion 143 of the light-reflective member 140C constitute a single curved surface. With this structure, light emitted from the second surface 32 can be inhibited from being shielded by the second curved surface 42 of the first portion 141 and the fourth curved surface 44 of the third portion 143.

Figure 8:
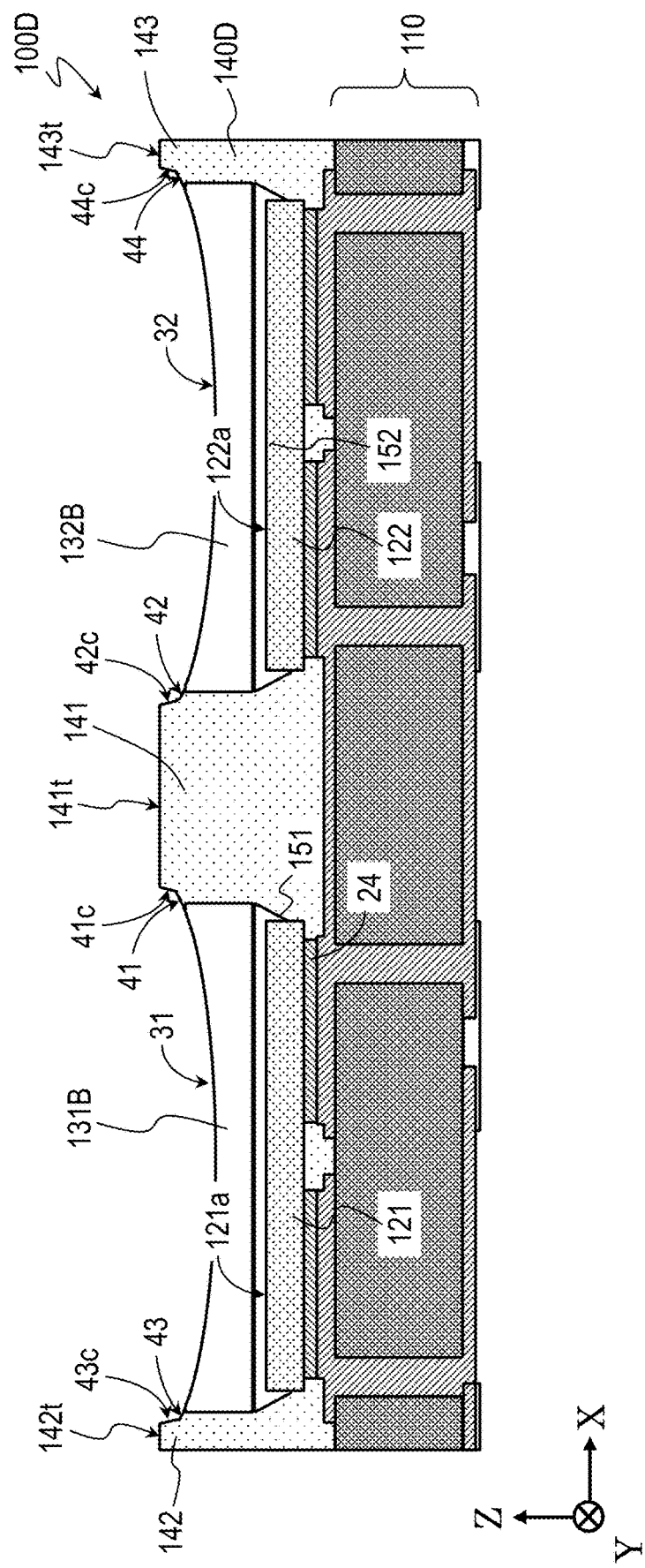
FIG. 8 is a schematic cross-sectional view of still another exemplary light-emitting device according to the second embodiment in the present disclosure.
Figure 9:
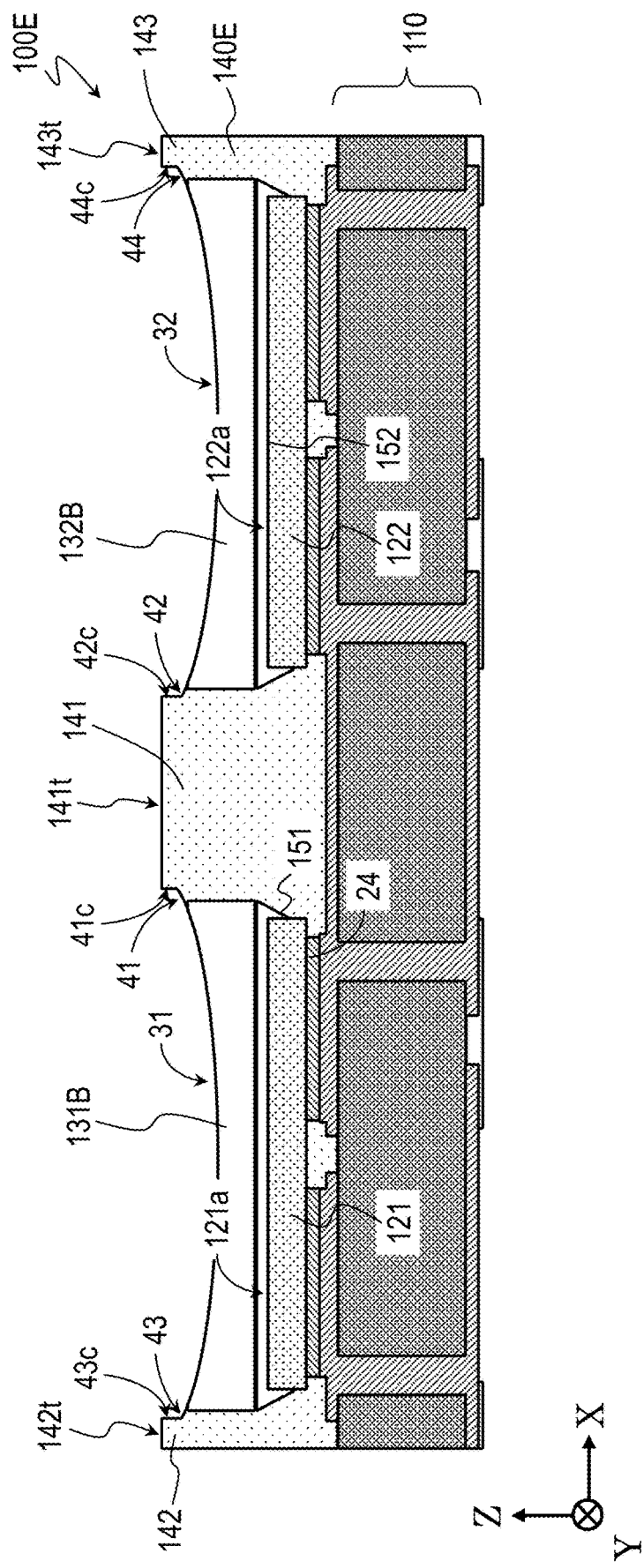
FIG. 9 is a schematic cross-sectional view of still another exemplary light-emitting device according to the second embodiment in the present disclosure.

FIG. 8 and FIG. 9 schematically show other examples of the first portion 141, the second portion 142, and the third portion 143 of the light-reflective member in the cross-sectional shape. A light-emitting device 100D shown in FIG. 8 includes a light-reflective member 140D, and a light-emitting device 100E shown in FIG. 9 includes a light-reflective member 140E. Similarly to the example described referring to FIG. 7, also in the examples shown in FIG. 8 and FIG. 9, the first curved surface 41 and the third curved surface 43 of the light-reflective member 140D or 140E constitute a single curved surface together with the first surface 31 of the first light-transmissive member 131B, and the second curved surface 42 and the fourth curved surface 44 of the light-reflective member 140D or 140E constitute a single curved surface together with the second surface 32 of the second light-transmissive member 132B.

In the example shown in FIG. 8, the surface of the first portion 141 of the light-reflective member 140D includes a substantially flat lateral surface 41c between the first top portion 141t and the first curved surface 41. Also, the surface of the second portion 142 of the light-reflective member 140D includes a substantially flat lateral surface 43c between the second top portion 142t and the third curved surface 43. In the illustrative structure shown in FIG. 8, the lateral surface 41c and the lateral surface 43c are inclined with respect to a plane perpendicular to the upper surface 121a of the first light-emitting element 121 to broaden upward. With this structure, light emitted from the first surface 31 can be inhibited from being shielded by the lateral surface 41c or the lateral surface 43c while the end portions of the first surface 31 are inhibited from being brought into contact with an external component such as a light-guiding plate.

Likewise, in this example, surfaces of the first portion 141 includes an substantially flat lateral surface 42c between the first top portion 141t and the second curved surface 42, and surfaces of the third portion 143 includes a substantially flat lateral surface 44c between the third top portion 143t and the fourth curved surface 44. The lateral surface 42c and the lateral surface 44c are also inclined with respect to a plane perpendicular to the upper surface 122a of the second light-emitting element 122 to broaden upward. With this structure, light emitted from the second surface 32 can be inhibited from being shielded by the lateral surface 42c and the lateral surface 44c while the end portions of the second surface 32 are inhibited from being brought into contact with an external component such as the light-guiding plate.

In the example shown in FIG. 9, the lateral surface 41c and the lateral surface 42c of the first portion 141 of the light-reflective member 140E, the lateral surface 43c of the second portion 142, and the lateral surface 44c of the third portion 143 are substantially perpendicular to the upper surface 121a of the first light-emitting element 121 and the upper surface 122a of the second light-emitting element 122. Also with this structure, the end portions of the first surface 31 and the end portions of the second surface 32 can be inhibited from being brought into contact with an external component such as the light-guiding plate. As described above, the surfaces of the first portion 141, the surfaces of the second portion 142, and the surfaces of the third portion 143 of the light-reflective member may have shapes each constituted of a combination of a curved line and a straight line in the ZX cross-section as described above.

Figure 10:
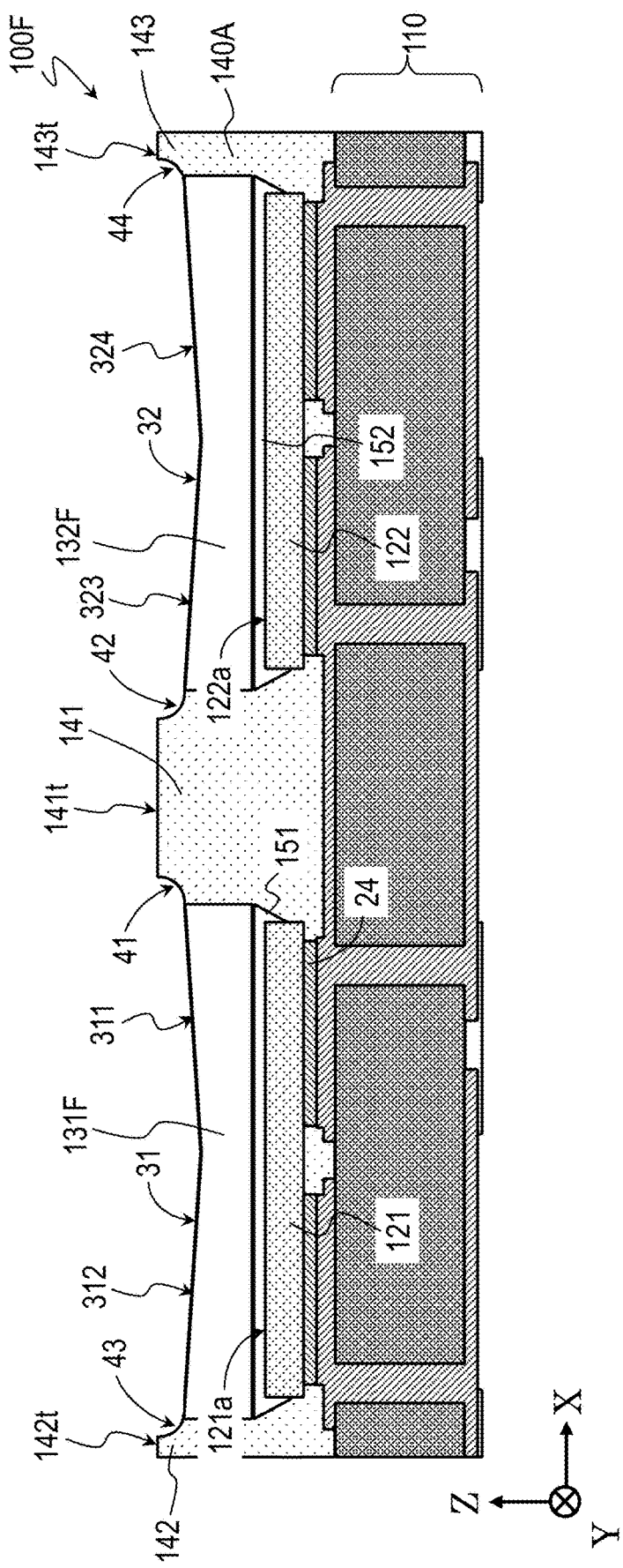
FIG. 10 is a schematic cross-sectional view of still another exemplary light-emitting device according to the second embodiment in the present disclosure.

FIG. 10 schematically shows still another example of the first surface 31 and the second surface 32 in the cross-sectional shape. A light-emitting device 100F shown in FIG. 10 differs from the light-emitting device 100B shown in FIG. 6 in including a first light-transmissive member 131F instead of the first light-transmissive member 131B and in including a second light-transmissive member 132F instead of the second light-transmissive member 132B. Similarly to the light-emitting device 100B, the first surface 31 and the second surface 32 exposed from the light-reflective member 140A have recessed shapes in the ZX cross-section.

As shown in FIG. 10, the central portion of the first surface 31 in the X direction in the drawings is located below both ends of the first surface 31 in the X direction. In this example, the first surface 31 is not a curved surface but is constituted of two inclined surfaces. The first surface 31 of the first light-transmissive member 131F includes a first inclined surface 311 inclined toward the upper surface 121a of the first light-emitting element 121, the first inclined surface 311 located between an end of the first surface 31 in the X direction in the drawings (such as the side closer to the first portion 141 of the light-reflective member 140A) and the central portion of the first surface 31, and a second inclined surface 312 inclined toward the upper surface 121a of the first light-emitting element 121, the second inclined surface 312 located between the other end of the first surface 31 and the central portion of the first surface 31. In other words, the first surface 31 has a substantially V-shaped in the ZX cross-section in this example.

The second surface 32 also has a substantially V-shape in the ZX cross-section in this example. That is, the second surface 32 of the second light-transmissive member 132F in this example includes a third inclined surface 323 inclined toward the upper surface 122a of the second light-emitting element 122, the third inclined surface 323 located between an end of the second surface 32 in the X direction in the drawings (such as the side closer to the first portion 141 of the light-reflective member 140A) toward the central portion of the second surface 32, and a fourth inclined surface 324 inclined toward the upper surface 122a of the second light-emitting element 122, the fourth inclined surface 324 located between the other end of the second surface 32 toward the central portion of the second surface 32.

According to the examinations carried out by the present inventors, similarly to the case in which the first surface 31 has a curved shape, light emitted from the first surface 31 and diverging in the X direction is likely to be concentrated on the central portion of the first surface 31 also in the case in which the first surface 31 is V-shaped in the ZX cross-section. That is, also with the first surface 31 having a V-shape in the ZX cross-section, the effect of inhibiting light from being shielded at the positions of the first curved surface 41 of the first portion 141 and the third curved surface 43 of the second portion 142 can be expected. Likewise, with the second surface 32 having a V-shape in the ZX cross section, light emitted from the second surface 32 and diverging in the X direction can be facilitated to concentrate on the central portion of the second surface 32, so that light can be inhibited from being shielded at the positions of the second curved surface 42 of the first portion 141 and the fourth curved surface 44 of the third portion 143.

Also in the light-emitting device 100F, each of the first surface 31 and the second surface 32 exposed from the light-reflective member has a shape recessed toward the light-emitting element (the first light-emitting element 121 or the second light-emitting element 122) in the ZX cross-section. Accordingly, similarly to the light-emitting device 100B to the light-emitting device 100E described above, divergence of light in the ZX plane can be reduced, and the optical coupling efficiency to the light-guiding plate can be enhanced in application to the backlight.

In the present embodiment, the above description focuses on the shapes of the first surface 31 and the second surface 32 in a cross-section (first cross-section, or the ZX cross-section in the drawing) orthogonal to both of a first plane parallel to the upper surface (the upper surface 121a or the upper surface 122a) of the light-emitting element and a second plane perpendicular to the direction (first direction, or the X direction in the drawing) in which two light-emitting elements are arrayed. As described referring to FIG. 6 to FIG. 10, each of the first surface 31 and the second surface 32 have a recessed shape in the ZX cross-section. On the other hand, both the first surface 31 and the second surface 32 are flat when the light-emitting device according to the present embodiment is cut along the second plane (second cross-section) perpendicular to the direction in which the two light-emitting elements are arrayed.

Figure 11:
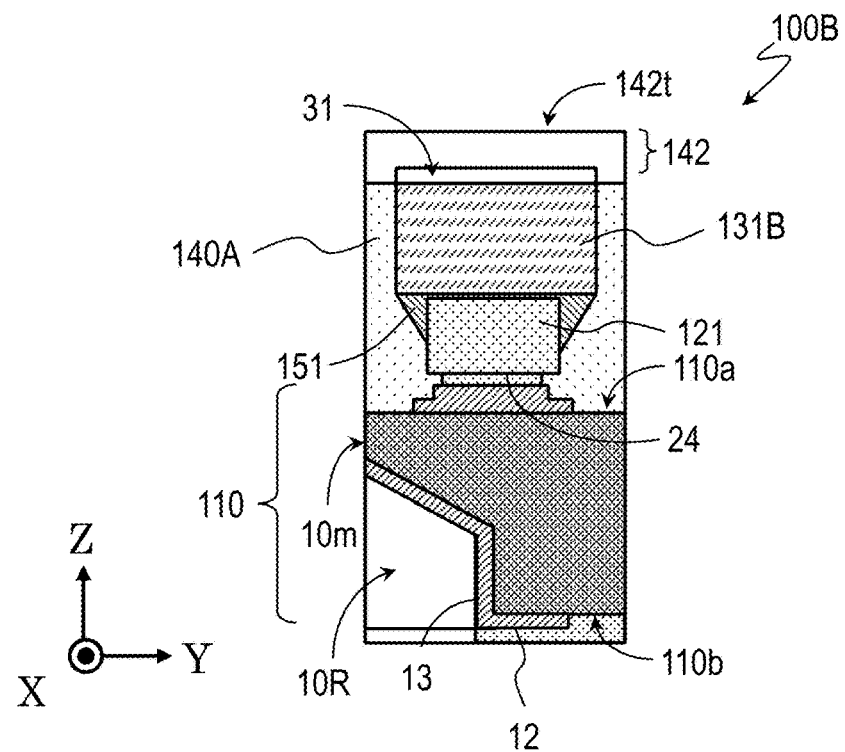
FIG. 11 is a schematic view of another cross-section of the exemplary light-emitting device according to the second embodiment in the present disclosure.
Figure 12:
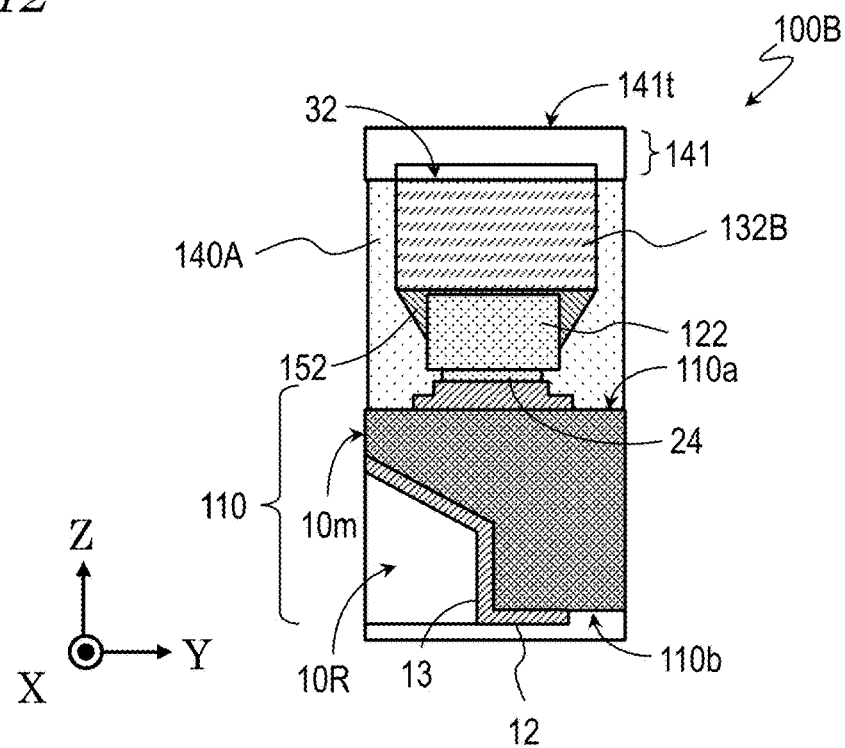
FIG. 12 is a schematic view of still another cross-section of the exemplary light-emitting device according to the second embodiment in the present disclosure.

FIG. 11 and FIG. 12 schematically show cross-sections that appear when the light-emitting device according to the second embodiment is cut perpendicularly to the direction in which the first light-emitting element and the second light-emitting element are arrayed. FIG. 11 schematically shows a cross-section of the light-emitting device 100B shown in FIG. 6 taken along a plane including the first light-emitting element 121, and FIG. 12 schematically shows a cross-section extending along a plane including the second light-emitting element 122. That is, FIG. 11 and FIG. 12 respectively show the XI-XI cross-section and the XII-XII cross-section of FIG. 6.

As shown in FIG. 11, the first surface 31 is flat in the YZ cross-section. As shown in FIG. 12, the second surface 32 is also flat in the YZ cross-section. As described above, each of the first surface 31 and the second surface 32 has a recessed shape in the ZX cross-section (first cross-section), while the first surface 31 and the second surface 32 are flat in the YZ cross-section (second cross-section) orthogonal to the ZX cross-section in the present embodiment. Accordingly, even if the first portion 141, the second portion 142, or the third portion 143 of the light-reflective member 140A is broken due to stress caused by contact with the light-guiding plate or the like, contact between portions of the outer peripheries of the first surface 31 and the second surface 32 extending in the X direction and the light-guiding plate can be avoided, so that changes in the light distribution characteristics of the light-emitting device before and after the breakage of the light-reflective member 140A can be greatly reduced. The first surface 31 and the second surface 32 are flat in the YZ cross-section (second cross-section) also in the first embodiment.

Figure 33D:
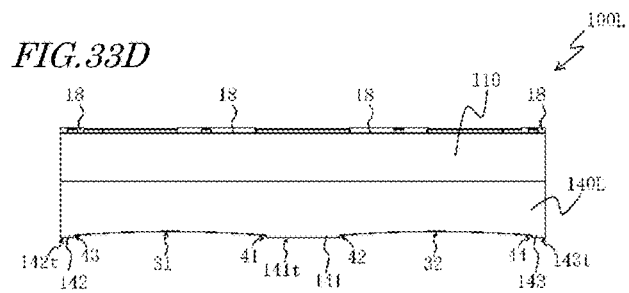
FIG. 33A to FIG. 33H include a schematic six-view drawing and a schematic perspective view of still another exemplary light-emitting device according to the second embodiment in the present disclosure.
Figure 33B:
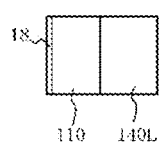
Figure 33A:
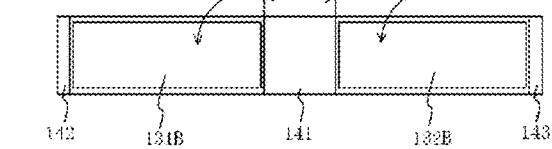
Figure 33C:
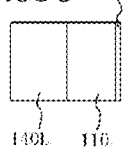
Figure 33E:
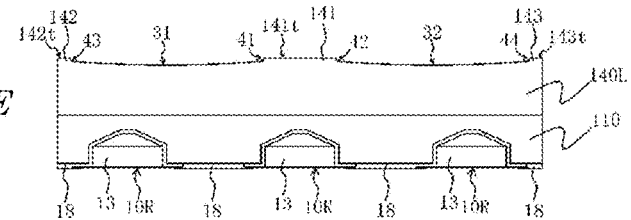
Figure 33F:
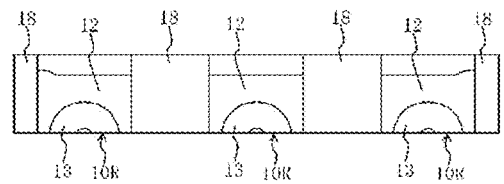
Figure 33G:
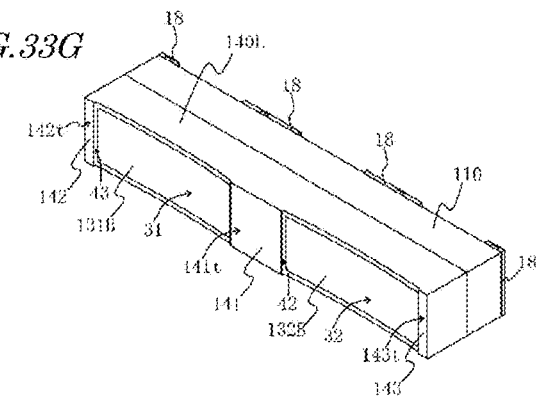
Figure 33H:
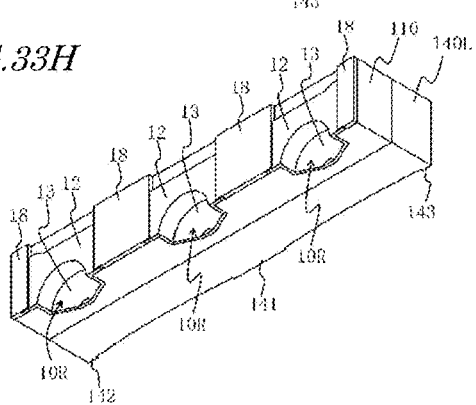
Figure 34D:
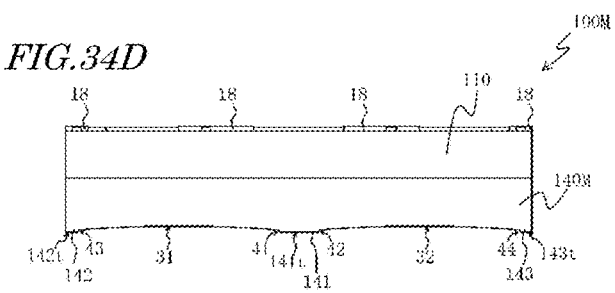
FIG. 34A to FIG. 34H include a schematic six-view drawing and a schematic perspective view of still another exemplary light-emitting device according to the second embodiment in the present disclosure.
Figure 34B:
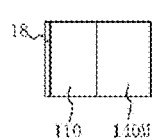
Figure 34A:
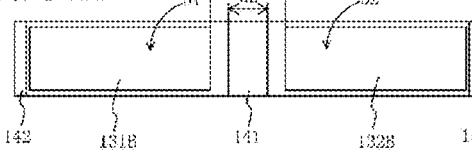
Figure 34C:
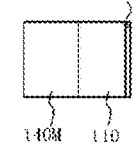
Figure 34E:
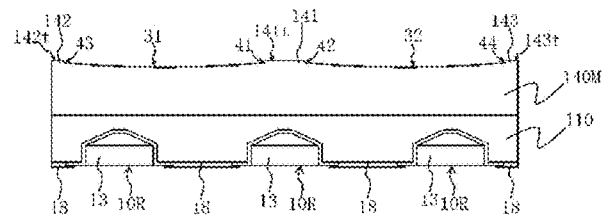
Figure 34F:
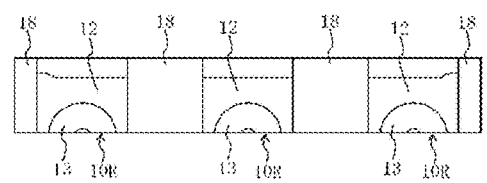
Figure 34G:
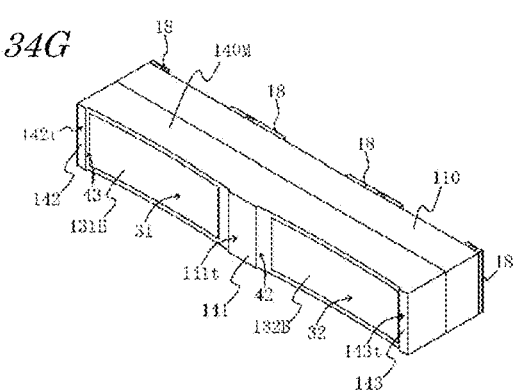
Figure 34H:
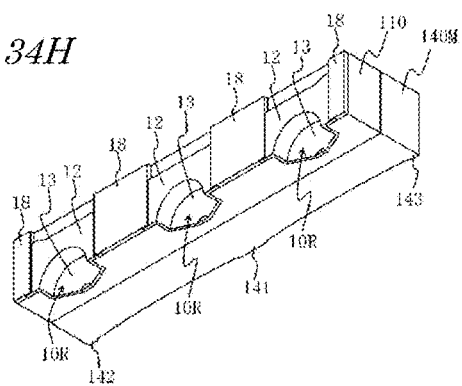

FIG. 33A to FIG. 33H and FIG. 34A to FIG. 34H include schematic six-view drawings and schematic perspective views of other exemplary light-emitting devices according to the second embodiment in the present disclosure. FIG. 33A and FIG. 34A are schematic front views, FIG. 33B and FIG. 34B are schematic left side views, FIG. 33C and FIG. 34C are schematic right side views, FIG. 33D and FIG. 34D are schematic plan views, FIG. 33E and FIG. 34E are schematic bottom views, FIG. 33F and FIG. 34F are schematic back views, FIG. 33G and FIG. 34G are schematic perspective views showing the front surface, the plane, and the right lateral surface, and FIG. 33H and FIG. 34H are schematic perspective views showing a back surface, a bottom surface, and a left lateral surface of the light-emitting device. Similarly to the example described referring to FIG. 7, also in the examples shown in FIGS. 33A to 33H and FIGS. 34A to 34H, the first curved surface 41 and the third curved surface 43 of a light-reflective member 140L or 140M constitute a single curved surface together with the first surface 31 of the first light-transmissive member 131B, and the second curved surface 42 and the fourth curved surface 44 of the light-reflective member 140L or 140M constitute a single curved surface together with the second surface 32 of the second light-transmissive member 132B. A light-emitting device 100L shown in FIG. 33A to FIG. 33H and a light-emitting device 100M shown in FIG. 34A to FIG. 34H differ from each other at least in widths d1 and d2 of the first top portion 141t in the direction of alignment of the first surface 31 and the second surface 32 in a front view. Specifically, the width d2 of the first top portion 141t of the light-emitting device 100M is smaller than the width d1 of the first top portion 141t of the light-emitting device 100L. For example, the width d2 of the first top portion 141t of the light-emitting device 100M is preferably about 40% or more and 60% or less, more preferably about 45% or more and 55% or less, of a width d3 between the first surface 31 and the second surface 32 to further inhibit light emitted from the first surface 31 and the second surface 32 from being shielded by the first portion 141.

Other Modifications

Subsequently, various modifications of the light-emitting device will be described. The light-emitting device 100B shown in FIG. 6 will be described as an example in the description below, but similar modifications are applicable to the other examples described above (the light-emitting device 100A, the light-emitting device 100C to the light-emitting device 100F, the light-emitting device 100L, and the light-emitting device 100M). Also, two or more of the modifications described below can be combined.

Figure 13:
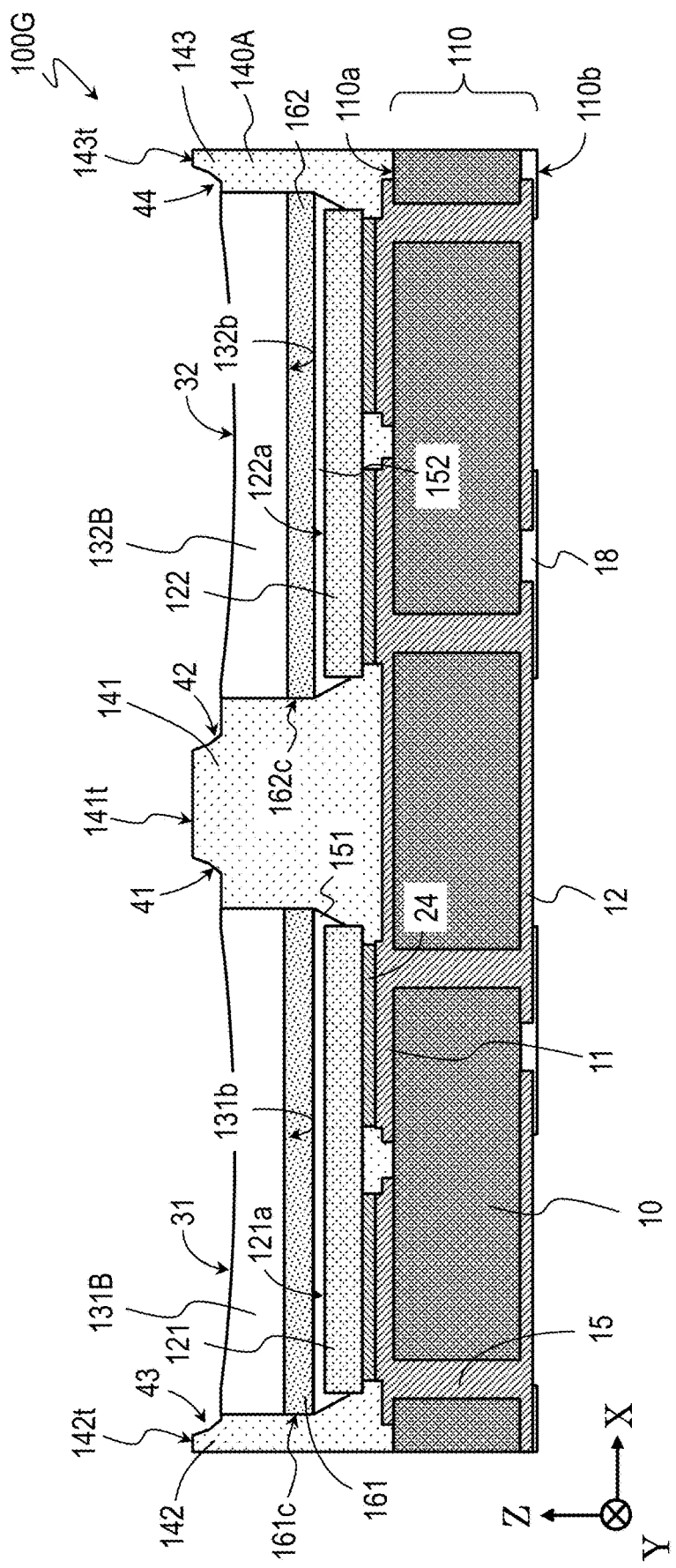
FIG. 13 is a schematic cross-sectional view of another exemplary modification of an exemplary light-emitting device according to the second embodiment in the present disclosure.

FIG. 13 schematically shows an example of a light-emitting device further including a first wavelength conversion member and a second wavelength conversion member. A light-emitting device 100G shown in FIG. 13 differs from the light-emitting device 100B shown in FIG. 6 in further including a first wavelength conversion member 161 located between the first light-transmissive member 131B and the first light-emitting element 121 and a second wavelength conversion member 162 located between the second light-transmissive member 132B and the second light-emitting element 122. In the illustrative structure shown in FIG. 13, the light-reflective member 140A is also in contact with lateral surfaces 161c of the first wavelength conversion member 161 and lateral surfaces 162c of the second wavelength conversion member 162.

Each of the first wavelength conversion member 161 and the second wavelength conversion member 162 includes a base material, particles of a phosphor, and the like, and the phosphor in the first wavelength conversion member 161 is adapted to absorb at least a portion of light emitted from the first light-emitting element 121 and to emit light with wavelengths different from the wavelengths of light emitted from the first light-emitting element 121. Likewise, the phosphor in the second wavelength conversion member 162 is adapted to absorb at least a portion of light emitted from the second light-emitting element 122 and to emit light with wavelengths different from the wavelengths of light emitted from the second light-emitting element 122.

Typical examples of the first light-emitting element 121 and the second light-emitting element 122 are LEDs configured to emit blue light. When using LEDs configured to emit blue light, the first wavelength conversion member 161 and the second wavelength conversion member 162 can perform wavelength conversion of a portion of incident blue light to emit, for example, yellow light. Such a structure allows for obtaining white light, which is mixture of blue light that has passed through the light-transmissive members and yellow light that is emitted from the phosphors contained in the light-transmissive members.

Figure 14:
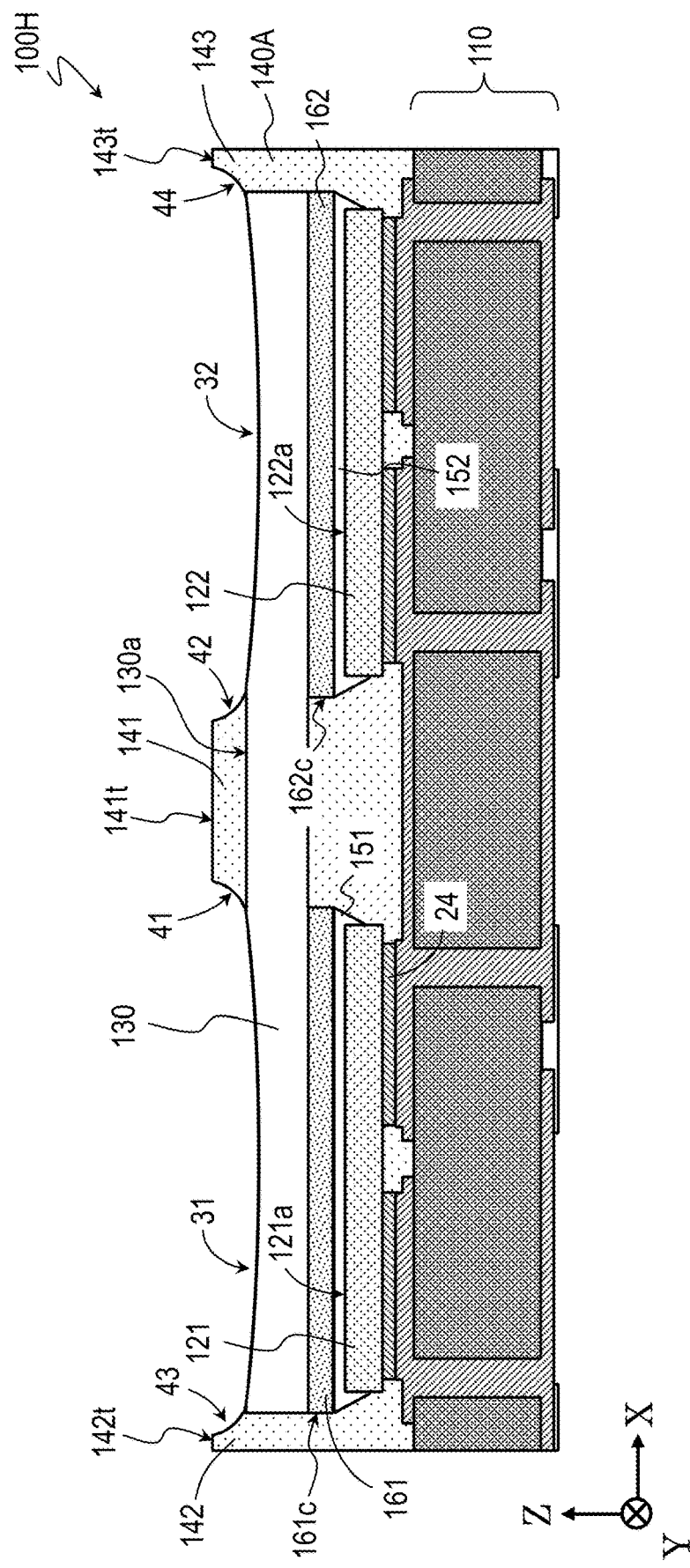
FIG. 14 is a schematic cross-sectional view of still another exemplary modification of an exemplary light-emitting device according to the second embodiment in the present disclosure.

FIG. 14 schematically shows an example in which a single light-transmissive member is disposed above the first light-emitting element and the second light-emitting element. A light-emitting device 100H shown in FIG. 14 differs from the light-emitting device 100G shown in FIG. 13 in including a light-transmissive member 130 that collectively covers the upper surface 121a of the first light-emitting element 121 and the upper surface 122a of the second light-emitting element 122 instead of the first light-transmissive member 131B and the second light-transmissive member 132B.

In each of the examples described above, the first light-transmissive member and the second light-transmissive member are respectively disposed above the first light-emitting element 121 and the second light-emitting element 122 corresponding to the first light-emitting element 121 and the second light-emitting element 122 included in the light-emitting device. But other than above, as illustrated in FIG. 14, the light-emitting device 100H may include a single light-transmissive member 130 covering both the upper surface 121a of the first light-emitting element 121 and the upper surface 122a of the second light-emitting element 122. Further, the first wavelength conversion member 161 and the second wavelength conversion member 162 may be respectively disposed above the first light-emitting element 121 and the second light-emitting element 122 as illustrated in FIG. 14, or a single wavelength conversion member 163 may be disposed covering both the upper surface 121a of the first light-emitting element 121 and the upper surface 122a of the second light-emitting element 122.

In the example shown in FIG. 14, a plurality of portions of an upper surface 130a of the light-transmissive member 130 are exposed from the light-reflective member 140A. Among these portions, a portion exposed from the light-reflective member 140A above the first light-emitting element 121 is the first surface 31, and a portion exposed from the light-reflective member 140A above the second light-emitting element 122 is the second surface 32. In this example, the first surface 31 and the second surface 32 are concave curved surfaces.

The light-transmissive member 130 disposed over both the first light-emitting element 121 and the second light-emitting element 122 allows light emitted from the first light-emitting element 121 and light emitted from the second light-emitting element 122 to be mixed together inside the light-transmissive member 130. More uniform light can thus be extracted from the first surface 31 and the second surface 32.

Figure 15:
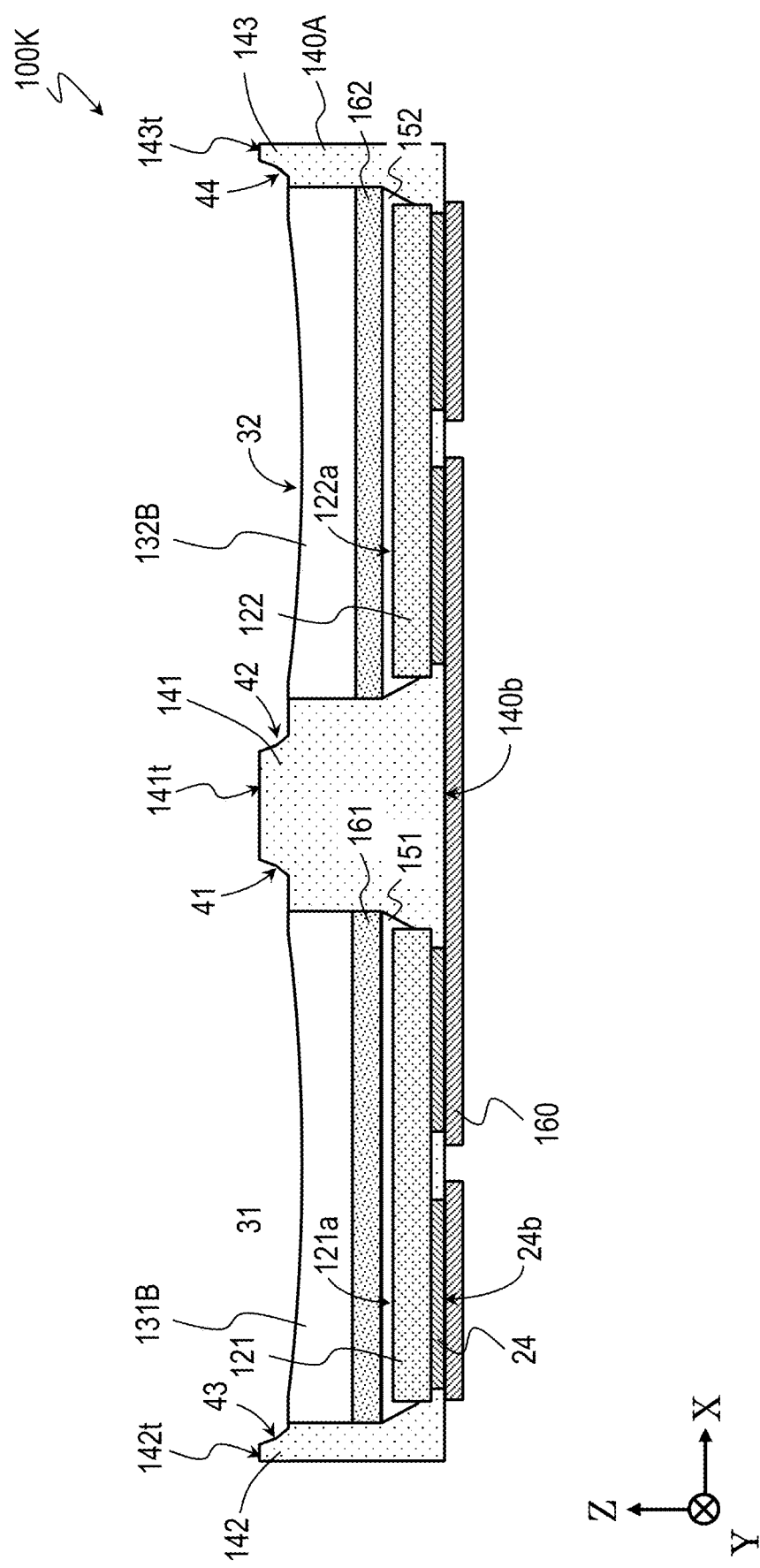
FIG. 15 is a schematic cross-sectional view of still another exemplary modification of an exemplary light-emitting device according to the second embodiment in the present disclosure.

FIG. 15 schematically shows still another modification of the light-emitting device. In each of the examples described above, the light-emitting device includes the substrate 110 on which the first light-emitting element 121 and the second light-emitting element 122 are mounted. On the other hand, a light-emitting device 100K shown in FIG. 15 includes a wiring layer 160 disposed below the first light-emitting element 121 and the second light-emitting element 122 instead of the substrate 110.

In the example shown in FIG. 15, lower surfaces 24b of the electrodes 24 of the first light-emitting element 121 and the second light-emitting element 122 are exposed in a lower surface 140b of the light-reflective member 140A. The wiring layer 160 is formed on the lower surface 140b of the light-reflective member 140A and electrically connected to the electrodes 24. FIG. 15 shows an example in which the wiring layer 160 electrically connects the first light-emitting element 121 and the second light-emitting element 122 in series. The substrate 110 can be omitted from the light-emitting device as in this example.

Figure 35:
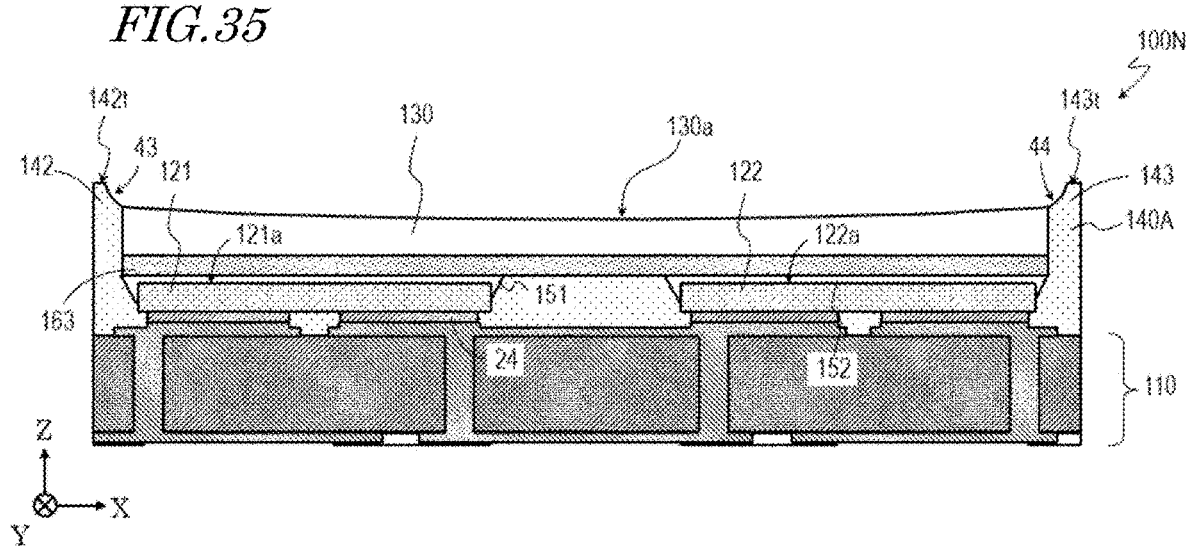
FIG. 35 is a schematic cross-sectional view of still another exemplary modification of an exemplary light-emitting device according to the second embodiment in the present disclosure.

FIG. 35 schematically shows an example in which a single light-transmissive member and a single wavelength conversion member are disposed above the first light-emitting element and the second light-emitting element. A light-emitting device 100N shown in FIG. 35 differs from the light-emitting device 100H shown in FIG. 14 in including the wavelength conversion member 163 that collectively covers the upper surface 121a of the first light-emitting element 121 and the upper surface 122a of the second light-emitting element 122 instead of the first wavelength conversion member 161 and the second wavelength conversion member 162. Further, the light-reflective member 140A in the light-emitting device 100N does not include the first portion 141, and the light-transmissive member 130 is exposed from the light-reflective member 140A above the region between the first light-emitting element 121 and the second light-emitting element 122.

The entire upper surface 130a of the light-transmissive member 130 may be exposed from the light-reflective member 140A as in the example shown in FIG. 35. Alternatively, a portion, such as end portions in the X direction, of the upper surface 130a of the light-transmissive member 130 may be covered with the light-reflective member 140A. The upper surface 130a of the light-transmissive member 130 is a concave curved surface. With this structure, light emitted from the upper surface 130a of the light-transmissive member 130 and diverging in the X direction is facilitated to be concentrated on the central portion of the upper surface 130a, so that light can be inhibited from being shielded at the positions of the third curved surface 43 of the second portion 142 and the fourth curved surface 44 of the third portion 143.

With the light-transmissive member 130 and the wavelength conversion member 163 disposed over both of the first light-emitting element 121 and the second light-emitting element 122, light emitted from the first light-emitting element 121 and light emitted from the second light-emitting element 122 are mixed together inside the light-transmissive member 130 and the wavelength conversion member 163. More uniform light can thus be extracted from an upper surface 10a of the light-transmissive member 130.

Members in the light-emitting device will be described below in detail.

Substrate 110

The substrate 110 is a supporting member on which the first light-emitting element 121 and the second light-emitting element 122 are mounted. The upper surface 110a of the substrate 110 typically has a rectangular shape that is longer in the X direction in the drawings than in the Y direction in the drawings, corresponding to the first light-emitting element 121 and the second light-emitting element 122 mounted to be arranged along the first direction (X direction in the drawings). As shown in FIG. 1 to FIG. 3, the substrate 110 has a substantially rectangular parallelepiped shape as a whole.

In the example of a structure shown in FIG. 3, the substrate 110 includes a base member 10 having an upper surface and a lower surface, first wirings 11, second wirings 12, and electrically conductive members 15 disposed inside the base member 10. The upper surface of the base member 10 is included in the upper surface 110a of the substrate 110, and the lower surface of the base member 10 is included in a lower surface 110b of the substrate 110 opposite to the upper surface 110a. The first wirings 11 and the second wirings 12 are located on the upper surface 110a side and the lower surface 110b side of the substrate 110, respectively. Each of the electrically conductive members 15 penetrate through the base member 10 to electrically connect a corresponding one of the first wirings 11 and a corresponding one of the second wirings 12 to each other.

The base member 10 is a substantially rectangular parallelepiped supporting member on which the first wirings 11 and the second wirings 12 are disposed. Examples of a material of the base member 10 include insulators such as resins, ceramics, and glass. The base member 10 may be formed of a composite material such as fiber-reinforced resin. For example, a glass epoxy substrate may be employed for the base member 10. An epoxy, bismaleimide-triazine (BT), a polyimide, or the like can be used as a base material of the base member 10. Aluminum oxide, aluminum nitride, zirconium oxide, zirconium nitride, titanium oxide, titanium nitride, or a mixture of one or more of these materials can be employed for the ceramic. Among these ceramics, it is advantageous to use a material having a coefficient of linear expansion close to the coefficients of linear expansion of the light-emitting elements for the material of the base member 10.

In view of the strength of the substrate 110, it is beneficial that the base member 10 has a thickness of 0.05 mm or more, more preferably 0.2 mm or more, in the Z direction. When the base member 10 has a thickness of 0.6 mm or less in the Z direction, a thickness of the light-emitting device can be greatly reduced. The base member 10 preferably has a thickness of 0.5 mm or less, more preferably 0.4 mm or less in the Z direction.

As illustrated in FIG. 2, FIG. 11, and FIG. 12, the base member 10 can define one or more recesses 10R each opening toward the lower surface and a bottom surface 10m of the base member 10. The bottom surface 10m of the base member 10 is a surface located between the upper surface and the lower surface of the base member 10 and facing the upper surface of the wiring substrate in the case of application to the backlight.

The substrate 110 further includes third wirings 13 each covering the inner wall defining a corresponding one of the recesses 10R. As shown in FIG. 11 and FIG. 12, the third wiring 13 is disposed on a surface of the base member 10 continuously with the second wiring 12 on the lower surface 110b of the substrate 110 and is thus electrically connected to the second wiring 12. In application to a backlight, the light-emitting device 100G can be mounted on the wiring substrate by disposing solder 90 into each of the recesses 10R as shown in FIG. 4.

Copper, iron, nickel, tungsten, chromium, aluminum, silver, platinum, gold, titanium, palladium, rhodium, or an alloy containing one or more of these metals can be used for a material of the first wirings 11, the second wirings 12, and the third wirings 13. In view of heat dissipation performance, it is advantageous to employ copper or a copper alloy for a material of these wirings. The first wirings 11, the second wirings 12, and the third wirings 13 may be disposed on the base member 10 in a form of a single-layer film or in a form of a layered film. When silver, platinum, aluminum, rhodium, gold, or an alloy containing one or more of these metals constitute the outermost surfaces of these wirings, the wirings can have high light reflectivity and good wettability for a solder and the like.

The same or a similar material as a material of the first wirings 11, the second wirings 12, or the third wirings 13 can be employed for a material of the electrically conductive members 15. The electrically conductive members 15 may occupy the whole of the inside of through holes defined in the base member 10 or may partially occupy the inside of the through holes; for example, the electrically conductive members 15 may be electrically conductive films disposed on surfaces defining the through holes. Further, the regions surrounded by the electrically conductive films may be filled with an insulating material such as an epoxy resin.

Figure 16:
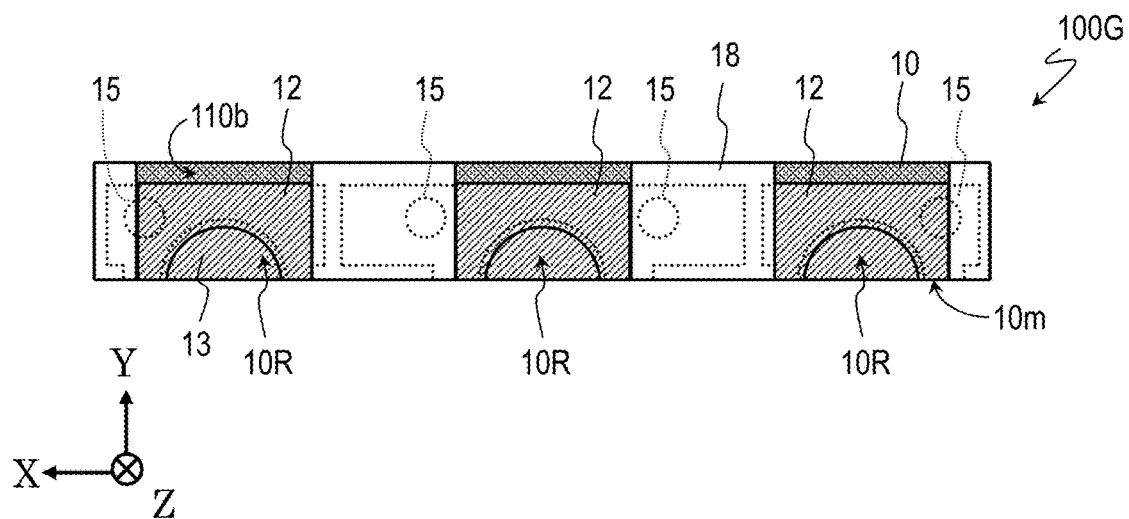
FIG. 16 is a schematic view of an exemplary external appearance of an exemplary light-emitting device according to an embodiment in the present disclosure when viewed from a lower surface side of a substrate.
Figure 17:
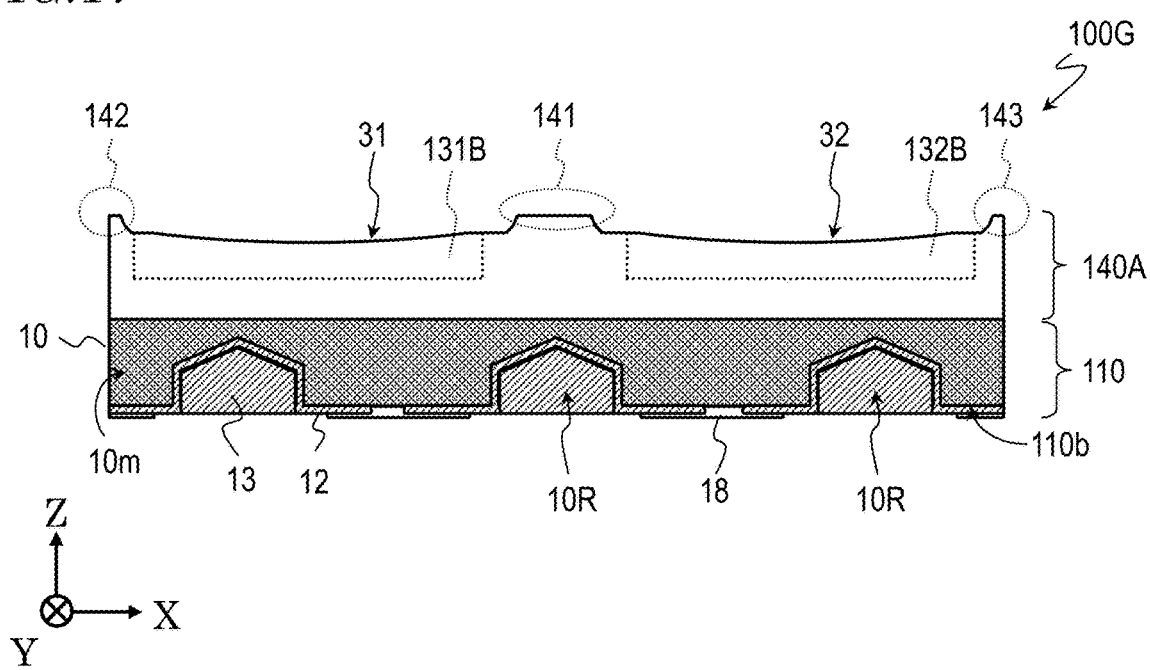
FIG. 17 is a schematic view of an exemplary external appearance of an exemplary light-emitting device according to an embodiment in the present disclosure when viewed from the side of a surface facing a wiring substrate.

FIG. 16 schematically shows an illustrative external appearance of the light-emitting device 100G when viewed from the lower surface 110b side of the substrate 110. FIG. 17 schematically shows an illustrative external appearance of the light-emitting device 100G when viewed from the bottom surface 10m side of the base member 10. In the example shown in FIG. 16, the opening of each recess 10R has a semicircular shape. The recesses 10R can be symmetric with respect to the center of the base member 10 in the X direction in the drawings. As schematically shown in FIG. 16, in this example, the electrically conductive members 15 are disposed at positions not overlapping with the recesses 10R.

In the illustrative structure shown in FIG. 16, the substrate 110 further includes one or more insulating layers 18. The insulating layers 18 are made of a thermosetting resin or a thermoplastic resin, and each of the insulating layers 18 covers a portion of a respective one of the second wirings 12 located on the lower surface of the base member 10. With such insulating layers 18 disposed on the lower surface 110b side of the substrate 110, an effect of preventing a short circuit between the portions of the second wiring 12 can be obtained.

Referring to FIG. 17, the shape of the opening of each recess 10R in the bottom surface 10m of the base member 10 is noted. As shown in FIG. 17, the recess 10R can have a shape having a depth in the Z direction larger in its central portion in the X direction than at both ends thereof in the X direction in the drawings. The recess 10R can have a shape in which the depth along the Z direction in the drawings increases toward the bottom surface 10m as shown in FIG. 11 and FIG. 12.

First Light-Emitting Element 121 and Second Light-Emitting Element 122

The first light-emitting element 121 and the second light-emitting element 122 are semiconductor elements that emit light when current is supplied. The basic structure of the first light-emitting element 121 and the second light-emitting element 122 can be substantially the same with each other. The structure of the first light-emitting element 121 will be mainly described below, and repetitive description of the second light-emitting element 122 will be omitted.

As described referring to FIG. 3, the first light-emitting element 121 includes the electrodes 24 located on the lower surface opposite to the upper surface 121a. The electrodes 24 include a positive electrode and a negative electrode. Examples of a material of the electrodes 24 include gold, silver, tin, platinum, rhodium, titanium, aluminum, tungsten, palladium, nickel, and an alloy containing one or more of these materials. The first light-emitting element 121 is mounted on the substrate 110 by connecting and securing the electrodes 24 to the first wiring 11 of the substrate 110 with bonding members such as solder.

The first light-emitting element 121 further includes a semiconductor layered structure including an n-type semiconductor layer, a p-type semiconductor layer, and an active layer between these layers. The semiconductor layered structure can be disposed on a supporting substrate made of sapphire, gallium nitride, or the like. When the first light-emitting element 121 includes the supporting substrate, the upper surface of the supporting substrate constitutes the upper surface 121a of the first light-emitting element 121. The electrodes 24 are disposed on a surface of the semiconductor layered structure opposite to the supporting substrate. Each of the electrodes 24 is electrically connected to the semiconductor layered structure and has the function of supplying a predetermined current to the semiconductor layered structure.

The semiconductor layered structure may contain a nitride semiconductor ($In_xAl_yGa_{1-x-y}N$, where $0 \leq x$, $0 \leq y$, and $x+y \leq 1$) configured to emit light in the ultraviolet light to visible light range. The first light-emitting element 121 and the second light-emitting element 122 may differ from each other in peak emission wavelengths. For example, a semiconductor layered structure configured to mainly emit blue light may be employed for the first light-emitting element 121, and a semiconductor layered structure that configured to mainly emit green light may be employed for the second light-emitting element 122.

First Light-Transmissive Member 131B and Second Light-Transmissive Member 132B

The first light-transmissive member 131B and the second light-transmissive member 132B are substantially plate-shaped members that are respectively disposed above the first light-emitting element 121 and the second light-emitting element 122. The first light-transmissive member 131B and the second light-transmissive member 132B function as a protective layer of the first light-emitting element 121 and the second light-emitting element 122, respectively.

The first light-transmissive member 131B and the second light-transmissive member 132B are formed of, for example, a resin material containing a silicone resin or the like as the base material. The first light-transmissive member 131B typically has a light transmittance of 60% or more with respect to the peak emission wavelength of the first light-emitting element 121. The same applies to the second light-transmissive member 132B. In view of effective use of light, it is beneficial that the light transmittances of the light-transmissive members (the first light-transmissive member 131B and the second light-transmissive member 132B) with respect to the peak emission wavelengths of the light-emitting elements be 70% or more, and it is more beneficial that the transmittances be 80% or more.

Examples of a base material of the first light-transmissive member 131B and the second light-transmissive member 132B include a silicone resin, a silicone modified resin, an epoxy resin, a phenolic resin, a polycarbonate resin, an acrylic resin, a polymethylpentene resin, a polynorbornene resin, and a material containing two or more of these resins. Glass can also be selected for a material of the first light-transmissive member 131B and the second light-transmissive member 132B.

In each of the first light-transmissive member 131B and the second light-transmissive member 132B, a light-diffusing material having a refractive index different from that of the base material may be dispersed in the base material, which allows the first light-transmissive member 131B and the second light-transmissive member 132B to have light-diffusing function. Examples of the light-diffusing material include particles of a resin having a refractive index different from the refractive index of the base material and particles of silicon oxide, aluminum oxide, zirconium oxide, or zinc oxide. Nanoparticles having a particle diameter defined by $D_{50}$ of 1 nm or more and 100 nm or less can be used for the light-diffusing material to be dispersed in the base material, which allows for increasing light scattering inside the light-transmissive members.

As described above, at least a portion of the upper surface 131a of the first light-transmissive member 131B and at least a portion of the upper surface 132a of the second light-transmissive member 132B are exposed from the light-reflective member 140A in certain embodiments in the present disclosure. That is, the first surface 31 of the first light-transmissive member 131B is a portion or the whole of the upper surface 131a, and the second surface 32 of the second light-transmissive member 132B is a portion or the whole of the upper surface 132a. In this example, each of the first surface 31 and the second surface 32 has a recessed shape in the first cross-section.

First Wavelength Conversion Member 161 and Second Wavelength Conversion Member 162

The first wavelength conversion member 161 is an substantially plate-shaped member located between the upper surface 121a of the first light-emitting element 121 and the lower surface 131b of the first light-transmissive member 131B. Likewise, the second wavelength conversion member 162 is an substantially plate-shaped member located between the upper surface 122a of the second light-emitting element 122 and the lower surface 132b of the second light-transmissive member 132B.

Each of the first wavelength conversion member 161 and the second wavelength conversion member 162 contain a base material and particles of a phosphor and the like dispersed in the base material. Examples of the base material of the first wavelength conversion member 161 and the second wavelength conversion member 162 include a silicone resin, a modified silicone resin, an epoxy resin, a modified epoxy resin, a urea resin, a phenolic resin, a polycarbonate resin, a trimethylpentene resin, a polynorbornene resin, an acrylic resin, a urethane resin, a fluorocarbon resin, and a resin containing two or more of these resins. Glass can also be selected for the base material of the first wavelength conversion member 161 and the second wavelength conversion member 162. In view of efficient introduction of light into the first light-transmissive member 131B, it is beneficial that a material of the first wavelength conversion member 161 have a refractive index lower than the refractive index of a material of the first light-transmissive member 131B. Likewise, it is beneficial that a material of the second wavelength conversion member 162 have a refractive index lower than the refractive index of a material of the second light-transmissive member 132B. Each of the first wavelength conversion member 161 and the second wavelength conversion member 162 may be constituted of a single layer or may include, for example, a layered structure including a plurality of resin layers.

A known material can be applied to the phosphor to be dispersed in the first wavelength conversion member 161 and the second wavelength conversion member 162. Examples of the phosphor include yttrium-aluminum-garnet based phosphors (such as $Y_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), β-SiAlON phosphors (such as $(Si,Al)_3(O,N)_4$:Eu), α-SiAlON phosphors (such as $Mz(Si,Al)_{12}(O,N)_{16}$ (where $0<z\leq 2$, M is Li, Mg, Ca, Y, or a lanthanoid element except for La and Ce)), nitride based phosphors such as CASN phosphors (such as $CaAlSiN_3$:Eu) and SCASN based phosphors (such as $(Sr,Ca)AlSiN_3$:Eu), fluoride based phosphors such as KSF based phosphors (such as $K_2SiF_6$:Mn) and MGF based phosphors (such as $3.5MgO \cdot 0.5MgF_2 \cdot GeO_2$:Mn), and CCA based phosphors (such as $(Ca,Sr)_{10}(PO_4)_6Cl_2$:Eu). A quantum-dot phosphor may also be used for the phosphor. The wavelength conversion member (the first wavelength conversion member 161 or the second wavelength conversion member 162) may contain one of these phosphors singly or contain two or more of these phosphors in combination.

For example, in the structure as shown in FIG. 13, with the wavelength conversion member disposed between the light-emitting element and the light-transmissive member, light emitted from the light-emitting element can be introduced into the light-transmissive member through the wavelength conversion member. This allows light after color mixing to be diffused inside the light-transmissive member, so that light, such as white light, with reduced unevenness in luminance can be extracted from the light-emitting device 100G through the first surface 31 or the second surface 32. With the structure in which light transmitted through the first wavelength conversion member 161 and light transmitted through the second wavelength conversion member 162 are introduced into the single light-transmissive member 130 as in the light-emitting device 100H shown in FIG. 14, the light transmitted through the first wavelength conversion member 161 and the light transmitted through the second wavelength conversion member 162 can be mixed inside the light-transmissive member 130. Thus, this structure is advantageous in uniformization of light.

The phosphor dispersed in the base material of the first wavelength conversion member 161 and the phosphor dispersed in the base material of the second wavelength conversion member 162 may be different from each other. A material having a refractive index different from that of the base material of the first wavelength conversion member 161 may be dispersed in a material of the first wavelength conversion member 161, which allows the first wavelength conversion member 161 to have light-diffusing function. Likewise, a material having a refractive index different from that of the base material of the second wavelength conversion member 162 may be dispersed in a material of the second wavelength conversion member 162, which allows the second wavelength conversion member 162 to have light-diffusing function. For example, particles of titanium dioxide or silicon oxide may be dispersed into the base material of the first wavelength conversion member 161 and/or the second wavelength conversion member 162.

First Bonding Member 151 and Second Bonding Member 152

Each of the first bonding member 151 and the second bonding member 152 is a light-transmissive member including at least a portion located on portions of the lateral surfaces 121c of the first light-emitting element 121 and a portion located on portions of the lateral surfaces 122c of the second light-emitting element 122 (see FIG. 3). The first wavelength conversion member 161 and the second wavelength conversion member 162 described above are respectively bonded to the first light-emitting element 121 and the second light-emitting element 122 via the first bonding member 151 and the second bonding member 152. The second bonding member 152 is substantially the same as the first bonding member 151. The first bonding member 151 will be mainly described below in detail, and the detailed description of the second bonding member 152 will be omitted.

The first bonding member 151 includes a portion located between the lateral surfaces 121c of the first light-emitting element 121 and the light-reflective member 140A. With the first bonding member 151, a portion of light emitted from a lateral surface 121c of the first light-emitting element 121 can enter the first bonding member 151. Light incident on the first bonding member 151 is reflected at the position of an outer surface 151c of the first bonding member 151 toward the first light-transmissive member 131B and is emitted toward the outside of the light-emitting device 100G through the first light-transmissive member 131B. Thus, with the first bonding member 151, light extraction efficiency can be increased.

A resin material containing a transparent resin as the base material can be used for a material of the first bonding member 151. For example, the same or a similar material as the base material of the first light-transmissive member 131B can be used for the base material of the first bonding member 151. A light-diffusing material having a refractive index different from that of the base material can be dispersed in the base material, which allows the first bonding member 151 to have light-diffusing function.

The shape of the outer surface 151c in a cross-sectional view may be other than a linear shape as shown in FIG. 13. The shape of the outer surface 151c in a cross-sectional view may be a shape formed by lines, a curved line convex toward the first light-emitting element 121, a curved line convex away from the first light-emitting element 121, or the like. When the outer surface 151c of the first bonding member 151 has the shape of a curved line convex away from the first light-emitting element 121 in a cross-sectional view, a larger portion of light emitted from the lateral surfaces 121c of the first light-emitting element 121 and transmitted through the first bonding member 151 can be more efficiently introduced toward the first light-transmissive member 131B. Accordingly, the light extraction efficiency can be more advantageously enhanced.

Light-Reflective Member 140A

The light-reflective member 140A is disposed on the upper surface 110a of the substrate 110 to surround the first light-emitting element 121 and the second light-emitting element 122, and covers the structure on the upper surface 110a of the substrate 110 except for the first surface 31 of the first light-transmissive member 131B and the second surface 32 of the second light-transmissive member 132B. In the example shown in FIG. 13, the light-reflective member 140A is in contact with the lateral surfaces 161c of the first wavelength conversion member 161 and the lateral surfaces 162c of the second wavelength conversion member 162 in addition to the lateral surfaces 131c of the first light-transmissive member 131B and the lateral surfaces 132c of the second light-transmissive member 132B (see FIG. 3).

The light-reflective member 140A is formed of, for example, a resin material in which a light-diffusing material is dispersed. Examples of the base material of the light-reflective member 140A include a silicone resin, a modified silicone resin, an epoxy resin, a urea resin, a polycarbonate resin, a phenolic resin, an acrylic resin, a urethane resin, a fluorocarbon resin, modified resins of these resins, and a resin containing two or more of these resins. As the light-diffusing material, particles of an inorganic or organic material having a refractive index higher than the refractive index of the base material can be used. Examples of the light-diffusing material include particles of titanium oxide, magnesium oxide, zirconium dioxide, potassium titanate, aluminum oxide, aluminum nitride, boron nitride, mullite, niobium oxide, barium sulfate, silicon oxide, various rare-earth oxides (such as yttrium oxide and gadolinium oxide), etc. It is beneficial that the light-reflective member 140A be white in color.

The term "light-reflective" as used in the present specification refers to having reflectance of 60% or more at the peak emission wavelength of the light-emitting element (the first light-emitting element 121 or the second light-emitting element 122). It is more beneficial that the reflectance of the light-reflective member 140A at the peak emission wavelength of the light-emitting element be 70% or more, and it is further beneficial that the reflectance be 80% or more.

The light-reflective member 140A covers surfaces of the first light-transmissive member 131B and surfaces of the second light-transmissive member 132B except for the first surface 31 and the second surface 32. A portion of the light-reflective member 140A can be located on a portion of the upper surface 131a of the first light-transmissive member 131B and/or a portion of the upper surface 132a of the second light-transmissive member 132B. In the illustrative structure shown in FIG. 14, the first portion 141 of the light-reflective member 140A is a portion of the light-reflective member 140A above the upper surface of the light-transmissive member 130, the portion being located between the first surface 31 and the second surface 32.

For example, a portion of the light-reflective member 140A can be located between the first light-emitting element 121 and the substrate 110 and between the second light-emitting element 122 and the substrate 110 as shown in FIG. 13. With the light-reflective member 140A between the first light-emitting element 121 and the substrate 110 and between the second light-emitting element 122 and the substrate 110, emission of light from the lower surface side of the light-emitting elements can be reduced, so that the effect of enhancing the utilization efficiency of light can be obtained.

Wiring Layer 160

In the example shown in FIG. 15, the light-emitting device 100K includes the wiring layer 160 disposed on the lower surface 140b of the light-reflective member 140A instead of the substrate 110. The wiring layer 160 is obtained by, for example, disposing an electrically conductive film such as a metal film on the lower surface 140b after disposing the light-reflective member 140A, and patterning the electrically conductive film. The same or a similar material as the materials of the first wiring 11, the second wiring 12, and the third wiring 13 can be employed as a material of the wiring layer 160. The wiring layer 160 may be disposed on the lower surface 140b of the light-reflective member 140A in the form of a single-layer film or in the form of a layered film.

Example of Method of Manufacturing Light-Emitting Device

Subsequently, an example of a method of manufacturing a light-emitting device according to an embodiment in the present disclosure will be schematically described referring to drawings. An example of the method of manufacturing the light-emitting device 100G shown in FIG. 13 is described here.

Figure 18:
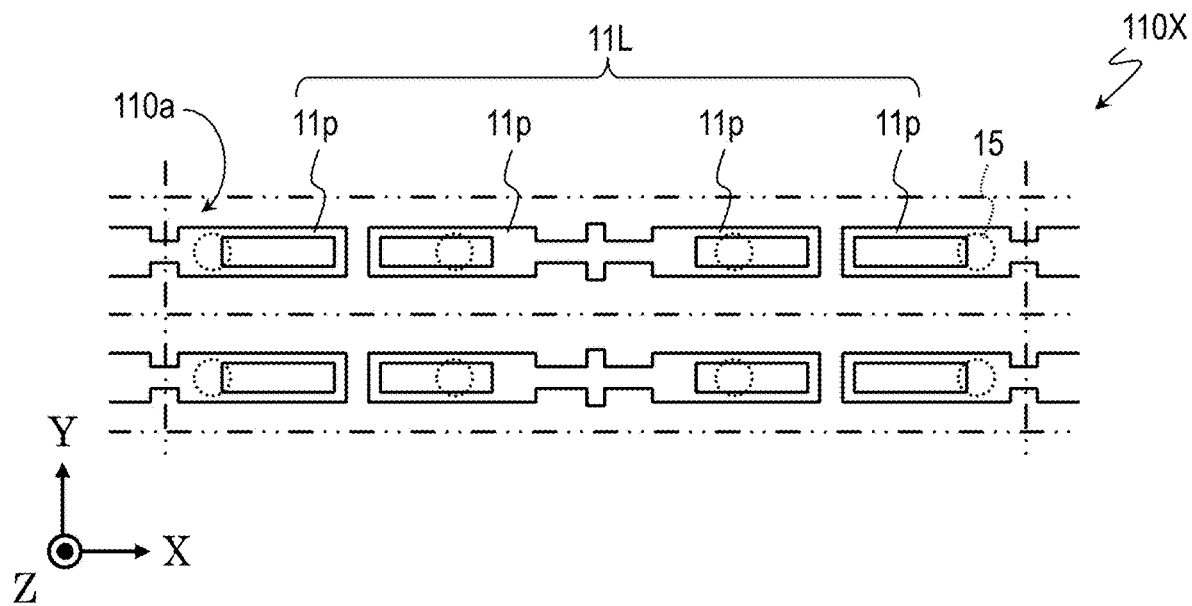
FIG. 18 is a schematic top view of an exemplary collective substrate on which light-emitting elements according to an embodiment in the present disclosure are to be mounted.
Figure 19:
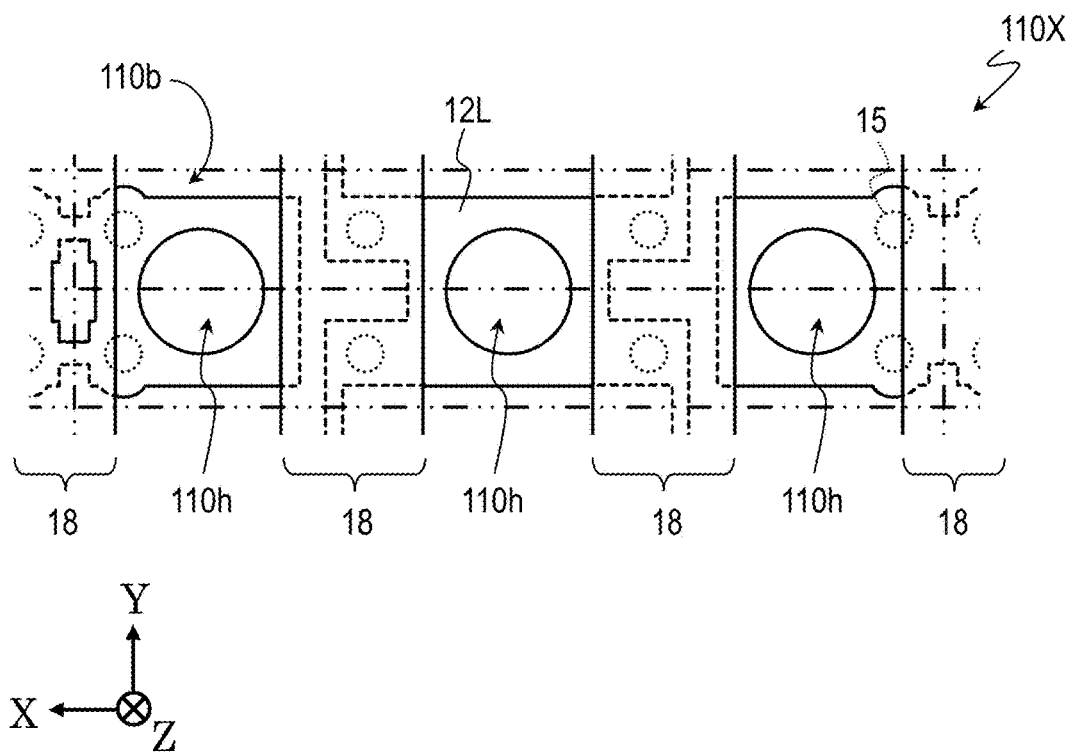
FIG. 19 is a schematic bottom view of the exemplary collective substrate on which the light-emitting elements according to an embodiment in the present disclosure are to be mounted.

A collective substrate 110X including a first electrically conductive layer 11L on the upper surface 110a and a second electrically conductive layer 12L on the lower surface 110b opposite to the upper surface 110a is provided. FIG. 18 and FIG. 19 schematically show examples of the external appearance of the collective substrate 110X when viewed from the upper surface 110a side and the external appearance of the collective substrate 110X when viewed from the lower surface 110b side, respectively. In this example, the electrically conductive members 15 connecting the first electrically conductive layer 11L to the second electrically conductive layer 12L are disposed at a plurality of locations in the collective substrate 110X.

The collective substrate 110X can be obtained by disposing electrically conductive films on both surfaces of a plate-shaped insulating base member by plating and then patterning the electrically conductive films. The first electrically conductive layer 11L includes a plurality of lands 11p as shown in FIG. 18. In the illustrative structure shown in FIG. 19, the lower surface 110b of the collective substrate 110X defines a plurality of holes 110h formed using a drill, a laser, or the like, and the second electrically conductive layer 12L is also disposed on the inner lateral surfaces defining the holes 110h. The insulating layer 18 is disposed on the lower surface 110b side of the collective substrate 110X to cover a portion of the second electrically conductive layer 12L in this case.

Figure 20:
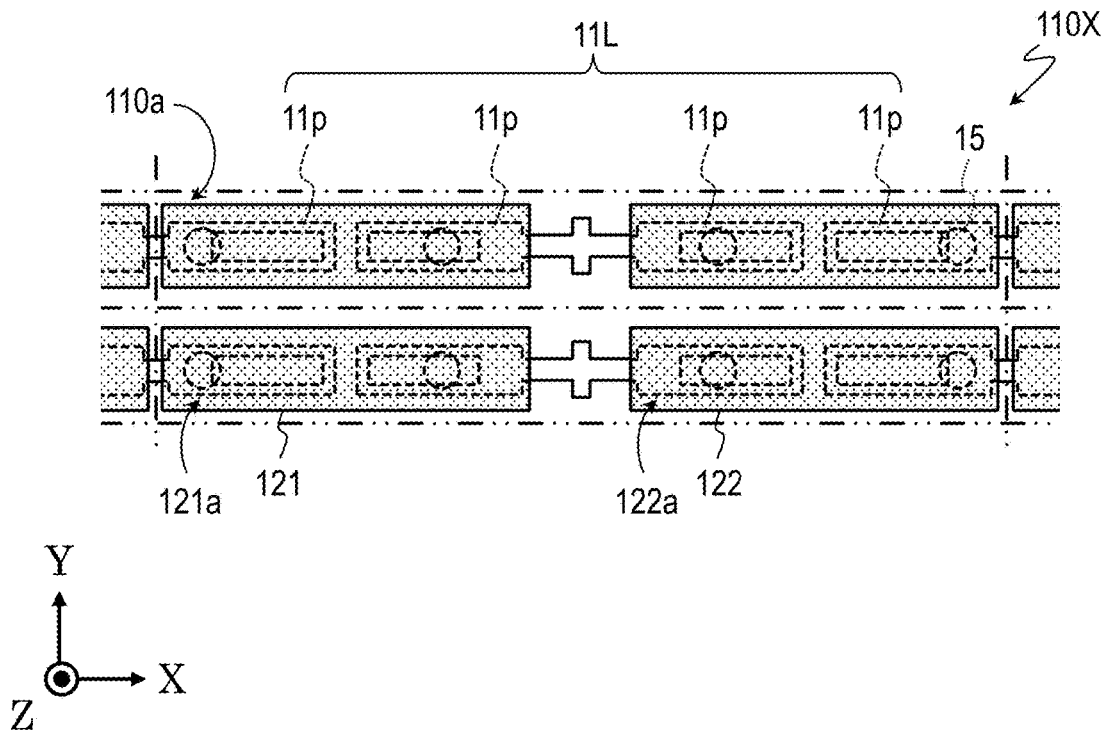
FIG. 20 is a schematic top view illustrating an exemplary method of manufacturing an exemplary light-emitting device according to an embodiment in the present disclosure.
Figure 21:
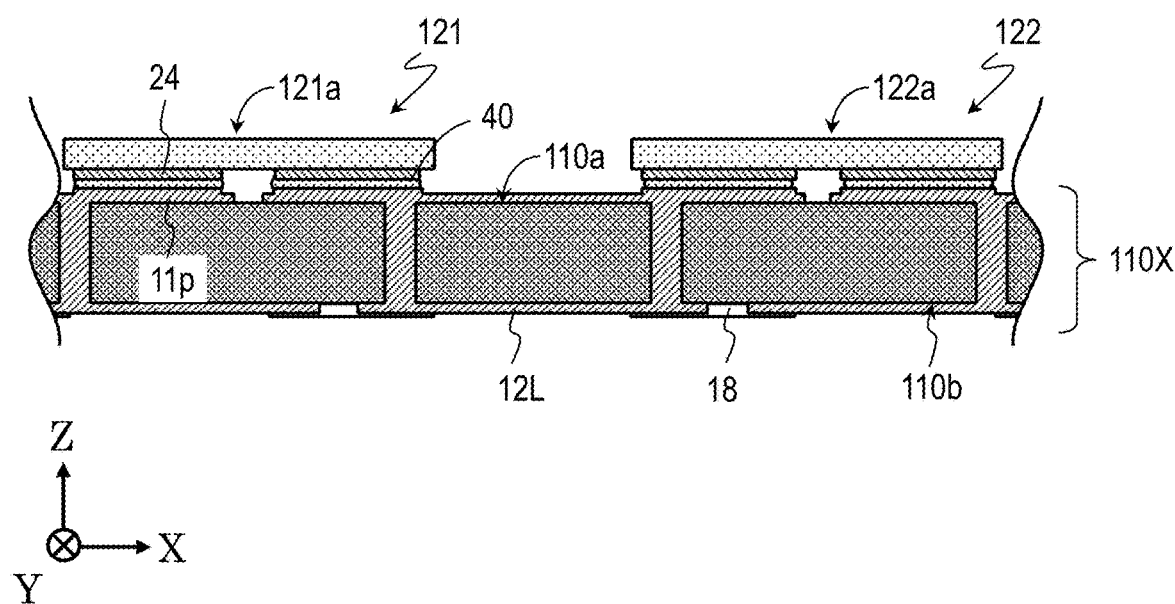
FIG. 21 is a schematic cross-sectional view illustrating the exemplary method of manufacturing the exemplary light-emitting device according to an embodiment in the present disclosure.

Subsequently, the first light-emitting element 121 and the second light-emitting element 122 are provided. In this example, as shown in FIG. 20, a plurality of pairs of the first light-emitting element 121 and the second light-emitting element 122 are provided, and these pairs are mounted in a two dimensional array on the upper surface 110a side of the collective substrate 110X along the X direction and the Y direction in the drawings. In this mounting, as shown in FIG. 21, the electrodes 24 of the first light-emitting elements 121 and the second light-emitting elements 122 are bonded to the lands 11p of the first electrically conductive layer 11L with electrically conductive adhesive members 40. Examples of the electrically conductive adhesive members 40 include bumps of gold, silver, or copper; electrically conductive paste, which is a mixture of powder of a metal such as gold, silver, copper, platinum, and aluminum and a resin binder; and tin-silver-copper (SAC) or tin-bismuth (SnBi) solder.

Figure 22:
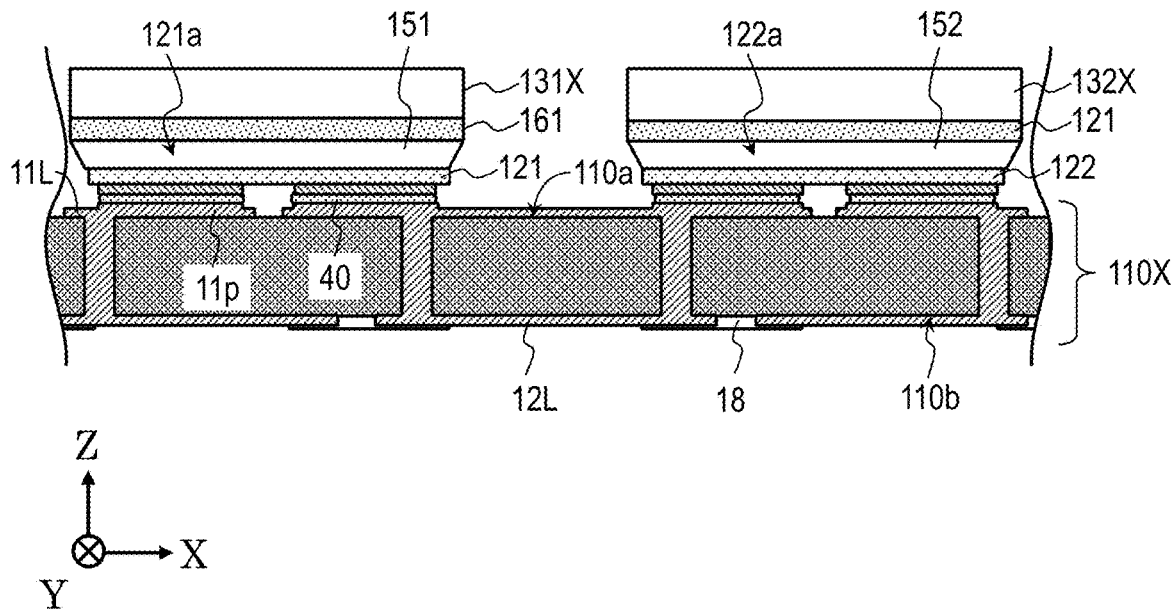
FIG. 22 is a schematic cross-sectional view illustrating the exemplary method of manufacturing the exemplary light-emitting device according to an embodiment in the present disclosure.

Subsequently, a light-transmissive adhesive is applied onto the upper surface 121a of the first light-emitting element 121 and the upper surface 122a of the second light-emitting element 122, and a plurality of pieces of a layered sheet each including a phosphor layer and a light-transmissive layer are bonded to these upper surfaces. Hardening the adhesive allows the adhesive to be formed into the first bonding member 151 and the second bonding member 152, and thus the first wavelength conversion member 161 and a first light-transmissive member 131X can be disposed above the upper surface 121a of the first light-emitting element 121 as shown in FIG. 22. Likewise, the second wavelength conversion member 162 and a second light-transmissive member 132X can be disposed above the upper surface 122a of the second light-emitting element 122. The pieces of a layered sheet can be obtained by, for example, applying a resin material containing particles of a phosphor onto a light-transmissive resin sheet and then hardening the resin material to provide a layered sheet, and cutting the layered sheet into predetermined dimensions.

Figure 23:
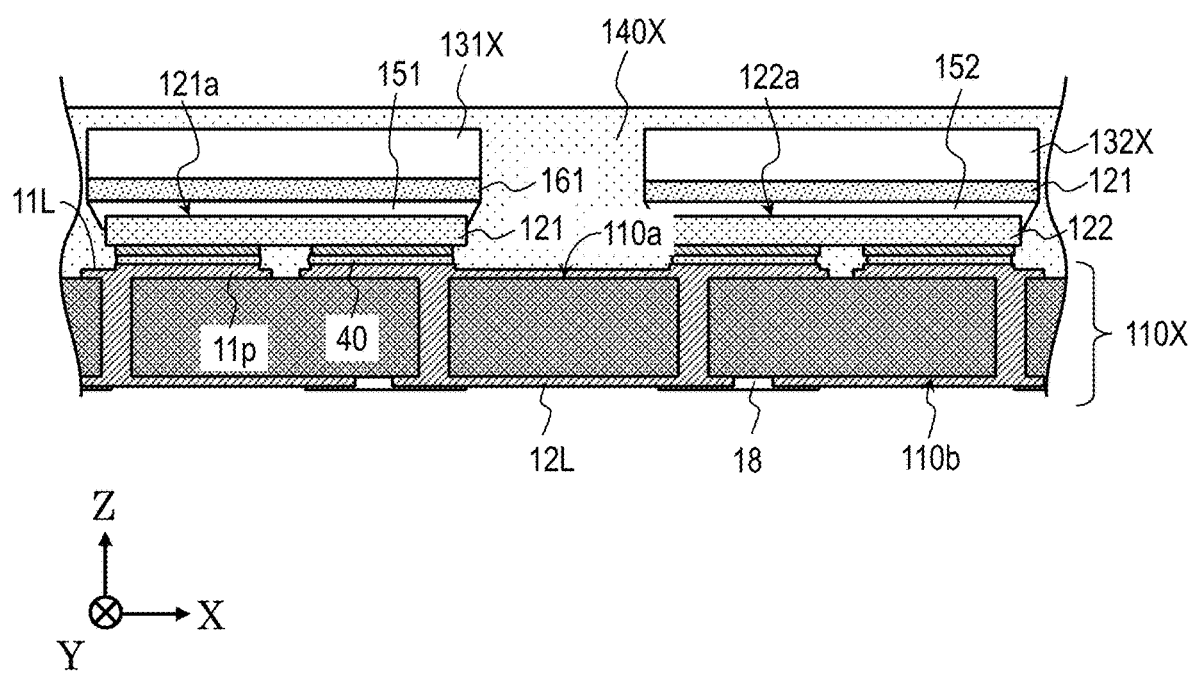
FIG. 23 is a schematic cross-sectional view illustrating the exemplary method of manufacturing the exemplary light-emitting device according to an embodiment in the present disclosure.

Subsequently, a material of the light-reflective member 140A is applied onto the upper surface 110a of the collective substrate 110X and hardened to form a light-reflective resin layer 140X covering the plurality of pairs of the first light-emitting element 121 and the second light-emitting element 122 as shown in FIG. 23. The light-reflective resin layer 140X has a thickness enough to cover the entire first light-transmissive member 131X and the entire second light-transmissive member 132X.

Figure 24:
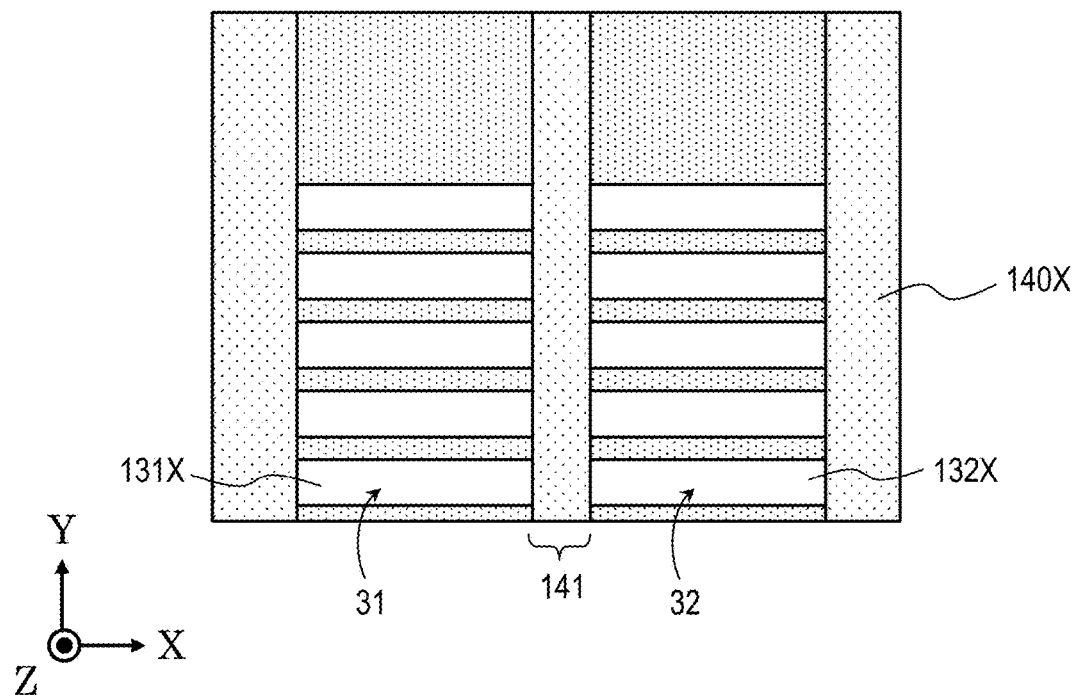
FIG. 24 is a schematic top view illustrating the exemplary method of manufacturing the exemplary light-emitting device according to an embodiment in the present disclosure.
Figure 25:
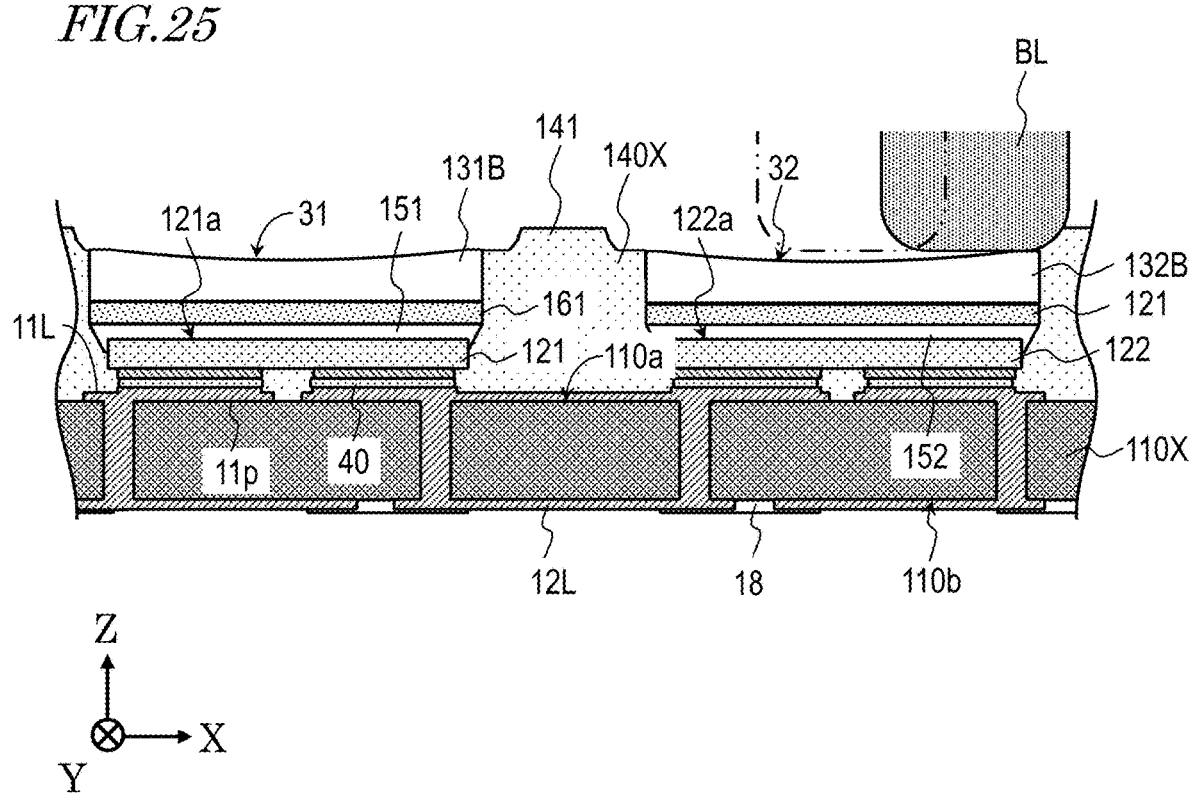
FIG. 25 is a schematic cross-sectional view illustrating the exemplary method of manufacturing the exemplary light-emitting device according to an embodiment in the present disclosure.

Subsequently, for example, a portion of the light-reflective resin layer 140X, a portion of the first light-transmissive member 131X, and a portion of the second light-transmissive member 132X are removed along the Y direction in the drawings by cutting with a grindstone (blade) (see FIG. 24). At this time, as schematically shown in FIG. 25, the upper surfaces of the first light-transmissive member 131X and the second light-transmissive member 132X can be formed into a recessed shape by moving a blade BL a plurality of times along the Y direction in the drawing. With adjustment in the shape of the edge of the blade BL, a surface of the light-reflective resin layer 140X can have a curved portion in a cross-sectional view. This cutting can form the first light-transmissive member 131B and the second light-transmissive member 132B from the first light-transmissive member 131X and the second light-transmissive member 132X, respectively.

After that, the collective substrate 110X and the light-reflective resin layer 140X are cut at positions (positions indicated by dash-dot-dot lines in FIG. 18 to FIG. 20) between a plurality of pairs of the first light-emitting element 121 and the second light-emitting element 122. This singulation can respectively form the substrate 110 and the light-reflective member 140A from the collective substrate 110X and the light-reflective resin layer 140X. The first wiring 11, the second wiring 12, and the third wiring 13 can also be formed from the first electrically conductive layer 11L and the second electrically conductive layer 12L. The third wiring 13 corresponds to the portions of the second electrically conductive layer 12L that have covered the inner lateral surfaces defining the holes 110h of the collective substrate 110X. A plurality of light-emitting devices 100G are obtained through the steps described above.

EXAMPLES

The influences of the shapes of the light-reflective member and the light-transmissive members of the light-emitting device on the optical coupling efficiency to the light-guiding plate were evaluated by ray tracing. Simulations were performed below using an optical analysis tool manufactured by Cybernet Systems Co., Ltd.

Example 1

A light-emitting device having a structure similar to that of the light-emitting device 100A shown in FIG. 1 to FIG. 3 was postulated as a sample of Example 1, and the light ray distribution in a state where the first surface 31 and the second surface 32 of the light-emitting device faced the light-guiding plate was determined by simulation. The simulation was performed below on the assumption that the first portion 141, the second portion 142, and the third portion 143 of the light-reflective member 140A extend perpendicularly upward from the first surface 31 or the second surface 32 in the first cross-section.

A height H1 of the first portion 141, a height of the second portion 142, and a height of the third portion 143 of the light-reflective member 140A was assumed to be 0.02 mm in the sample of Example 1. It was postulated that the shapes of the first surface 31 of the first light-transmissive member 131A and the second surface 32 of the second light-transmissive member 132A be flat surfaces in the example herein. Accordingly, in the simulation for the sample of Example 1, the distance between the light-transmissive member and the light-guiding plate was 0.02 mm.

Other basic settings for the simulation were as follows.

The wavelength of light emitted from the light-emitting elements 121 and 122: 455 nm The refractive index of sapphire substrates in the light-emitting elements 121 and 122: 1.77

The refractive index of the semiconductor layered structures in the light-emitting elements 121 and 122: 2.383

The refractive index of the bonding members 151 and 152: 1.47

The refractive index of the wavelength conversion members 161 and 162: 1.5

The refractive index of the light-reflective member 140A: 1.5

The material of the light-guiding plate: acrylic resin

The number of light rays: three million

Example 2

A simulation for a sample of Example 2 was performed in substantially the same manner as for the sample of Example 1 except that the first surface 31 and the second surface 32 were assumed to be curved surfaces respectively recessed toward the first light-emitting element 121 and the second light-emitting element 122 in the first cross-section. The distance between an end of the first surface 31 and the central portion of the first surface 31 along the Y direction in the drawings and the distance between an end of the second surface 32 and the central portion of the second surface 32 along the Y direction in the drawings were both assumed to be 0.02 mm. That is, the distance between the central portion of the first surface 31 and the light-guiding plate along the Y direction in the drawings and the distance between the central portion of the second surface 32 and the light-guiding plate along the Y direction in the drawings were both assumed to be 0.04 mm in the sample of Example 2.

Example 3

A simulation for a sample of Example 3 was performed in substantially the same manner as for the sample of Example 2 except that the heights of the first portion 141, the second portion 142, and the third portion 143 of the light-reflective member 140A were assumed to be 0.04 mm. That is, the distance between the central portion of the first surface 31 and the light-guiding plate along the Y direction in the drawings and the distance between the central portion of the second surface 32 and the light-guiding plate along the Y direction in the drawings were both assumed to be 0.06 mm in the sample of Example 3.

Example 4

A light-emitting device having a structure similar to that of the light-emitting device 100F shown in FIG. 10 was postulated as a sample of Example 4, and a simulation was performed. That is, the first surface 31 and the second surface 32 were assumed to be V-shaped in the first cross-section in the sample of Example 4. The distance between an end of the first surface 31 and the central portion of the first surface 31 along the Y direction in the drawings and the distance between an end of the second surface 32 and the central portion of the second surface 32 along the Y direction in the drawings were assumed to be 0.04 mm. That is, similarly to the sample of Example 2, the distance between the central portion of the first surface 31 and the light-guiding plate along the Y direction in the drawings and the distance between the central portion of the second surface 32 and the light-guiding plate along the Y direction in the drawings were both assumed to be 0.04 mm in the sample of Example 4.

Reference Example 1

A simulation for a sample of Reference Example 1 was performed in substantially the same manner as for the sample of Example 1 except that the light-reflective member 140A was assumed to include none of the first portion 141, the second portion 142, and the third portion 143. The entire light-transmissive member in the sample of Reference Example 1 is assumed to be in contact with the light-guiding plate.

Reference Example 2

A simulation for a sample of Reference Example 2 was performed in substantially the same manner as for the sample of Reference Example 1 except that the light-emitting device was assumed to be disposed at a location 0.02 mm away from the light-guiding plate. Similarly to the sample of Example 1, the distance between the light-transmissive member and the light-guiding plate was 0.02 mm in the sample of Reference Example 2.

Reference Example 3

A simulation for a sample of Reference Example 3 was performed in substantially the same manner as for the sample of Reference Example 2 except that the first surface 31 and the second surface 32 were assumed to be curved surfaces respectively recessed toward the first light-emitting element 121 and the second light-emitting element 122 in the first cross-section. Similarly to the sample of Example 1, the distance between an end of the first surface 31 and the central portion of the first surface 31 along the Y direction in the drawings and the distance between an end of the second surface 32 and the central portion of the second surface 32 along the Y direction in the drawings were both assumed to be 0.02 mm. In the sample of Reference Example 3, the distance between the central portion of the light-transmissive member and the light-guiding plate was 0.02 mm.

Reference Example 4

A simulation for a sample of Reference Example 4 was performed in substantially the same manner as for the sample of Reference Example 3 except that the distance between an end of the first surface 31 and the central portion of the first surface 31 along the Y direction in the drawings and the distance between an end of the second surface 32 and the central portion of the second surface 32 along the Y direction in the drawings were assumed to be 0.05 mm. In the sample of Reference Example 4, the distance between the central portion of the light-transmissive member and the light-guiding plate was 0.05 mm.

Reference Example 5

A simulation for a sample of Reference Example 5 was performed in substantially the same manner as for the sample of Reference Example 4 except that the distance between an end of the first surface 31 and the central portion of the first surface 31 along the Y direction in the drawings and the distance between an end of the second surface 32 and the central portion of the second surface 32 along the Y direction in the drawings were assumed to be 0.10 mm. In the sample of Reference Example 5, the distance between the central portion of the light-transmissive member and the light-guiding plate was 0.10 mm.

Evaluation of Optical Coupling Efficiency

The proportion of light rays entering the light-guiding plate (component except for the Fresnel reflection component) was calculated as the optical coupling efficiency of each sample, and the following results were obtained.

Example 1: 94.4%, Example 2: 92.9%, Example 3: 89.8%
Reference Example 1: 98.8%, Reference Example 2: 94.5%, Reference Example 3: 95.4%, Reference Example 4: 92.5%, Reference Example 5: 86.3%

The results of calculations of the optical coupling efficiency for the sample of Reference Example 1 and the optical coupling efficiencies for the sample of Example 1 and the sample of Reference Example 2 show that the optical coupling efficiency decreases with increase in distance between the light-transmissive member and the light-guiding plate. A comparison between the results of calculations of the optical coupling efficiencies for the sample of Example 2 and the sample of Example 3 and the optical coupling efficiency for the sample of Reference Example 3 shows that the optical coupling efficiency decreases with increase in distance between the light-guiding plate and the central portion of the light-transmissive member. A comparison between the results of calculations of the optical coupling efficiency for the sample of Example 1 and the optical coupling efficiency for the sample of Example 2 shows that the first surface 31 and the second surface 32 having recessed shapes are expected to allow the optical coupling efficiency to gently decrease with increase in distance between the light-guiding plate and the central portion of the light-transmissive member even in the case in which the distance between the light-guiding plate and the central portion of the light-transmissive member is increased.

Figure 30:
FIG. 30 schematically shows the result of calculations of the irradiance of a sample of Reference Example 1 inside the light-guiding plate.
Figure 31:
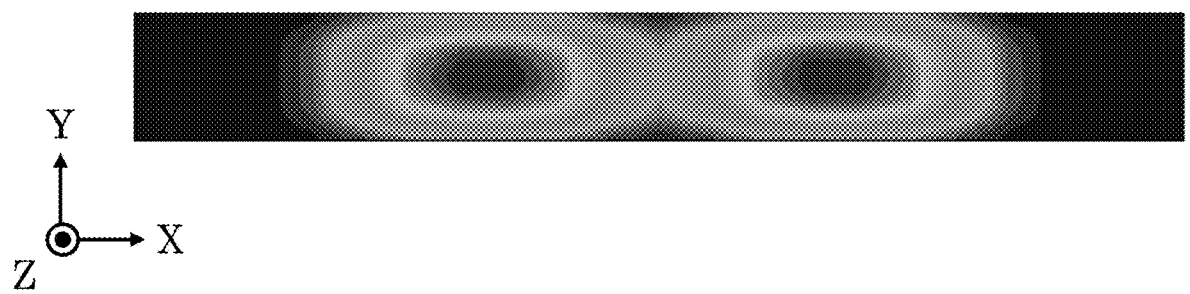
FIG. 31 schematically shows the result of calculations of the irradiance of a sample of Reference Example 4 inside the light-guiding plate.
Figure 32:
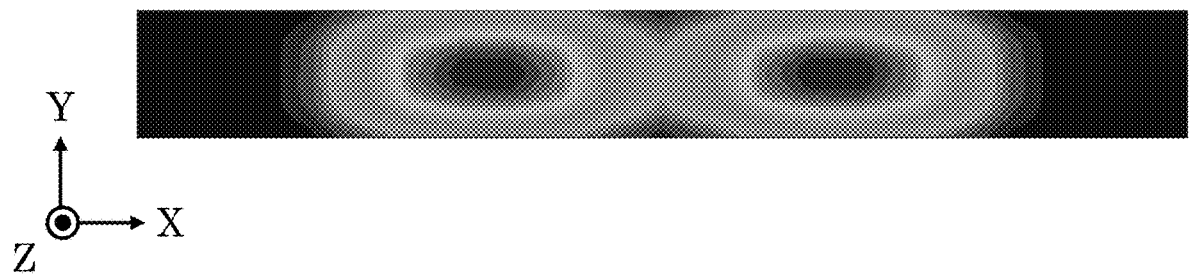
FIG. 32 schematically shows the result of calculations of the irradiance of a sample of Reference Example 5 inside the light-guiding plate.

FIG. 26 to FIG. 32 schematically show the result of a calculation of the irradiance of each sample at a position 0.1 mm inside the lateral surface of the light-guiding plate. FIG. 26 to FIG. 29 respectively show the results of calculations for the samples of Example 1 to Example 4. FIG. 30, FIG. 31, and FIG. 32 respectively show the results of calculations for Reference Example 1, Reference Example 4, and Reference Example 5.

Figure 26:
FIG. 26 schematically shows the result of calculations of the irradiance of a sample of Example 1 inside a light-guiding plate.
Figure 27:
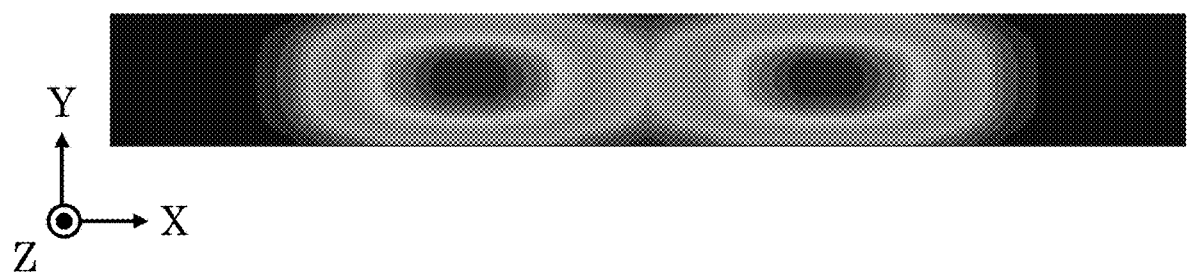
FIG. 27 schematically shows the result of calculations of the irradiance of a sample of Example 2 inside the light-guiding plate.
Figure 28:
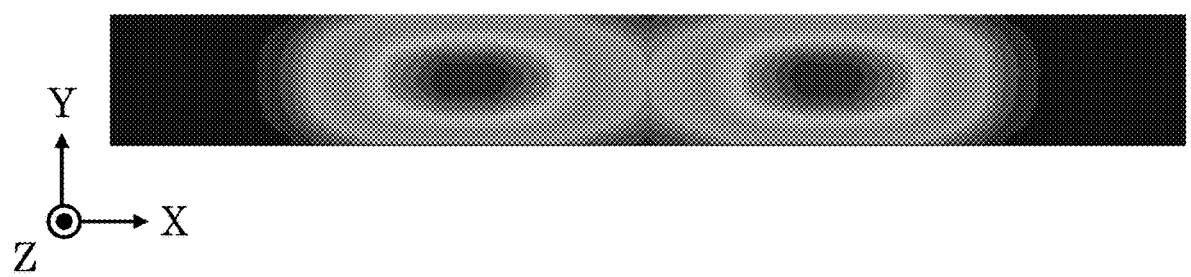
FIG. 28 schematically shows the result of calculations of the irradiance of a sample of Example 3 inside the light-guiding plate.
Figure 29:
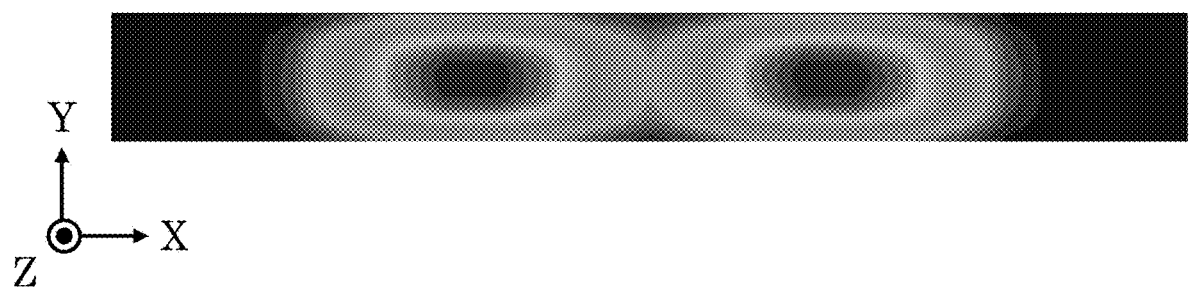
FIG. 29 schematically shows the result of calculations of the irradiance of a sample of Example 4 inside the light-guiding plate.

A comparison between FIG. 26 showing the simulation result for the sample of Example 1 and FIG. 28 showing the simulation result for the sample of Example 3 shows that the irradiance at the position of the first portion 141 between the first surface 31 and the second surface 32 has slightly smaller in Example 3. This result is supposed to indicate that the first surface 31 and the second surface 32 in recessed shapes allows for reducing divergence of light in a plane (ZX plane) parallel to the first cross-section. That is, with the first surface 31 and the second surface 32 having recessed shapes, diffusing of light between the light-emitting device and the light-guiding plate is reduced, so that an effect can be obtained in which a component that is incident on the first portion 141 and thus does not reach the light-guiding plate is reduced.

Certain embodiments in the present disclosure are useful for various light sources for lighting, light sources for vehicles, light sources for displays, and the like. In particular, the embodiments can be advantageously applied to a backlight unit for a liquid-crystal display. The light-emitting devices according to certain embodiments in the present disclosure can be advantageously used for a backlight for a display device of a mobile device, for which reduction in thickness is strictly demanded.

In the description above, certain embodiments of the present invention are described. However, the present invention is not limited the description above, and should be broadly construed on the basis of the claims. The present invention also encompasses variations and modifications that are made on the basis of the description above.

What is claimed is:

1. A light-emitting device comprising:
   a first light-emitting element and a second light-emitting element that are arranged along a first direction and each having an upper surface and lateral surfaces;
   at least one light-transmissive member having at least one lateral surface and covering the upper surface of the first light-emitting element and the upper surface of the second light-emitting element; and
   a light-reflective member in contact with at least portions of the lateral surfaces of the first light-emitting element, at least portions of the lateral surfaces of the second light-emitting element, and the lateral surface of the light-transmissive member,
   wherein the light-transmissive member has a first surface and a second surface that are exposed from the light-reflective member, the first surface being located above the upper surface of the first light-emitting element, the second surface being located above the upper surface of the second light-emitting element,
   wherein the light-reflective member comprises a first portion located between the first surface and the second surface in the first direction above the first surface and the second surface, and
   wherein the first portion includes at least one concave curved surface in a first cross-section extending along the first direction and being perpendicular to the upper surface of the first light-emitting element.

2. The light-emitting device according to claim 1,
   wherein the first portion has a first top portion,
   wherein the at least one concave curved surface includes a first curved surface and a second curved surface,
   wherein the first curved surface is located between the first top portion of the first portion and the first surface of the light-transmissive member in the first cross-section, and
   wherein the second curved surface is located between the first top portion of the first portion and the second surface of the light-transmissive member in the first cross-section.

3. The light-emitting device according to claim 2, wherein the first surface and the second surface are recessed in the first cross-section.

4. The light-emitting device according to claim 3,
   wherein the light-reflective member further includes a second portion and a third portion that are located above the first surface and the second surface of the light-transmissive member,
   wherein the second portion is located opposite to the first portion with respect to a position of the first surface in the first direction, and
   wherein the third portion is located opposite to the first portion with respect to a position of the second surface in the first direction.

5. The light-emitting device according to claim 3,
   wherein the first surface includes:
       a first inclined surface between an end of the first surface and a central portion of the first surface, the first inclined surface inclined toward the upper surface of the first light-emitting element in the first cross-section; and
       a second inclined surface between another end of the first surface and the central portion of the first surface, the second inclined surface inclined toward the upper surface of the first light-emitting element in the first cross-section, and
   wherein the second surface includes:
       a third inclined surface between an end of the second surface and a central portion of the second surface, the third inclined surface inclined toward the upper surface of the second light-emitting element in the first cross-section; and
       a fourth inclined surface between another end of the second surface and the central portion of the second surface, the fourth inclined surface inclined toward the upper surface of the second light-emitting element in the first cross-section.

6. The light-emitting device according to claim 4,
   wherein the second portion and the third portion of the light-reflective member respectively have a second top portion and a third top portion,
   wherein surfaces of the second portion includes a third curved surface having a concave shape between the second top portion and the first surface of the light-transmissive member in the first cross-section,
   wherein surfaces of the third portion includes a fourth curved surface having a concave shape between the third top portion and the second surface of the light-transmissive member in the first cross-section,
   wherein the first curved surface of the first portion of the light-reflective member, the first surface of the light-transmissive member, and the third curved surface of the second portion of the light-reflective member constitute a first single curved surface in the first cross-section, and
   wherein the second curved surface of the first portion of the light-reflective member, the second surface of the light-transmissive member, and the fourth curved surface of the third portion of the light-reflective member constitute a second single curved surface in the first cross-section.

7. The light-emitting device according to claim 1,
   wherein the first surface is flat in a second cross-section perpendicular to the first direction, and
   wherein the second surface is flat in the second cross-section.

8. The light-emitting device according to claim 1,
wherein the at least one light-transmissive member comprises:
- a first light-transmissive member above the upper surface of the first light-emitting element; and
- a second light-transmissive member above the upper surface of the second light-emitting element, and wherein the first light-transmissive member and the second light-transmissive member respectively have the first surface and the second surface.

9. The light-emitting device according to claim 8, further comprising:
- a first wavelength conversion member between the first light-transmissive member and the first light-emitting element; and
- a second wavelength conversion member between the second light-transmissive member and the second light-emitting element.

10. The light-emitting device according to claim 1, further comprising a substrate supporting the first light-emitting element and the second light-emitting element,
wherein the light-reflective member covers at least a portion of an upper surface of the substrate.

11. The light-emitting device according to claim 4,
wherein the first surface includes:
- a first inclined surface between an end of the first surface and a central portion of the first surface, the first inclined surface inclined toward the upper surface of the first light-emitting element in the first cross-section; and
- a second inclined surface between another end of the first surface and the central portion of the first surface, the second inclined surface inclined toward the upper surface of the first light-emitting element in the first cross-section, and wherein the second surface includes:
- a third inclined surface between an end of the second surface and a central portion of the second surface, the third inclined surface inclined toward the upper surface of the second light-emitting element in the first cross-section; and
- a fourth inclined surface between another end of the second surface and the central portion of the second surface, the fourth inclined surface inclined toward the upper surface of the second light-emitting element in the first cross-section.

* * * * *